US006950716B2

(12) United States Patent
Ward et al.

(10) Patent No.: US 6,950,716 B2
(45) Date of Patent: Sep. 27, 2005

(54) DYNAMIC CONTROL OF WAFER PROCESSING PATHS IN SEMICONDUCTOR MANUFACTURING PROCESSES

(75) Inventors: Nicholas A. Ward, San Jose, CA (US); Richard Danielson, Pleasanton, CA (US); David B. Corey, Sandy, UT (US)

(73) Assignee: Applied Materials, Inc., Santa Clara, CA (US)

( * ) Notice: Subject to any disclaimer, the term of this patent is extended or adjusted under 35 U.S.C. 154(b) by 300 days.

(21) Appl. No.: 09/927,444

(22) Filed: Aug. 13, 2001

(65) Prior Publication Data

US 2003/0029383 A1 Feb. 13, 2003

(51) Int. Cl.$^7$ .............................................. G06F 19/00
(52) U.S. Cl. ........................ 700/121; 700/19; 700/49; 700/103; 438/5
(58) Field of Search .............................. 700/19, 49, 52, 700/99–104, 108–111, 119–121, 123; 438/5–18; 118/719; 29/25.01; 427/9

(56) References Cited

U.S. PATENT DOCUMENTS

| | | | |
|---|---|---|---|
| 4,901,218 A | 2/1990 | Cornwell | |
| 4,957,605 A | 9/1990 | Hurwitt et al. | |
| 5,126,028 A | * 6/1992 | Hurwitt et al. | ........ 204/192.13 |
| 5,240,552 A | 8/1993 | Yu et al. | |
| 5,270,222 A | 12/1993 | Moslehi | |
| 5,369,544 A | 11/1994 | Mastrangelo | |
| 5,427,878 A | 6/1995 | Corliss | |
| 5,444,837 A | 8/1995 | Bomans et al. | |
| 5,665,214 A | 9/1997 | Iturralde | |
| 5,695,810 A | 12/1997 | Dubin et al. | |
| 5,761,065 A | 6/1998 | Kittler et al. | |
| 5,787,021 A | 7/1998 | Samaha | |
| 5,824,599 A | 10/1998 | Schacham-Diamand et al. | |
| 5,825,356 A | 10/1998 | Habib et al. | |

(Continued)

FOREIGN PATENT DOCUMENTS

| | | |
|---|---|---|
| EP | 0 397 924 A1 | 11/1990 |
| EP | 0 932 195 A1 | 7/1999 |
| EP | 1 083 470 A2 | 3/2001 |
| GB | 2 365 215 A | 2/2002 |

OTHER PUBLICATIONS

US 6,150,664, 11/2000, Su (withdrawn)

Chemali, Chadi El, James Moyne, Kareemullah Khan, Rock Nadeau, Paul Smith, John Colt, Jonathan Chapple–Sokol, and Tarun Parikh. Jul./Aug. 2000. "Multizone Uniformity Control of a Chemical Mechanical Polishing Process Utilizing a Pre– and Postmeasurement Strategy." J. Vac. Sci. Technol. A, vol. 18(4). pp. 1287–1296. American Vacuum Society.

Sep. 15, 2004. Office Action for U.S. Appl. No. 10/632,107, filed Aug. 1, 2003.

Sep. 29, 2004. Office Action for U.S. Appl. No. 09/363,966, filed Jul. 29, 1999.

(Continued)

*Primary Examiner*—Leo Picard
*Assistant Examiner*—Sean Shechtman
(74) *Attorney, Agent, or Firm*—Wilmer Cutler Pickering Hale & Dorr

(57) ABSTRACT

A semiconductor fabrication system, method and medium are disclosed. The system includes a semiconductor fabrication tool and a software application, in communication with the semiconductor fabrication tool. The semiconductor fabrication tool includes a chamber configured to perform at least one process on a semiconductor wafer. The software application is configured to determine specified qualities of the first chamber in performing the at least one process. The specified qualities are directed to at least one of: a processing time required to perform the at least one process, a rate of producing defective output products of the at least one process, a uniformity of output products of the at least one process, and a capability index of the at least one process.

8 Claims, 18 Drawing Sheets

U.S. PATENT DOCUMENTS

| | | | |
|---|---|---|---|
| 5,831,851 A | | 11/1998 | Eastburn et al. |
| 5,838,951 A | | 11/1998 | Song |
| 5,859,777 A | | 1/1999 | Yokoyama et al. |
| 5,862,054 A | * | 1/1999 | Li ........................ 364/468.28 |
| 5,871,805 A | | 2/1999 | Lemelson |
| 5,912,678 A | | 6/1999 | Saxena et al. |
| 5,923,553 A | | 7/1999 | Yi |
| 5,926,690 A | | 7/1999 | Toprac et al. |
| 5,943,550 A | | 8/1999 | Fulford, Jr. et al. |
| 5,975,994 A | | 11/1999 | Sandhu et al. |
| 6,012,048 A | | 1/2000 | Gustin et al. |
| 6,037,664 A | | 3/2000 | Zhao et al. |
| 6,059,636 A | | 5/2000 | Inaba et al. |
| 6,074,443 A | * | 6/2000 | Venkatesh et al. ......... 29/25.01 |
| 6,096,649 A | | 8/2000 | Jang |
| 6,100,195 A | | 8/2000 | Chan et al. |
| 6,111,634 A | | 8/2000 | Pecen et al. |
| 6,113,462 A | | 9/2000 | Yang |
| 6,114,238 A | | 9/2000 | Liao |
| 6,136,163 A | | 10/2000 | Cheung et al. |
| 6,150,270 A | | 11/2000 | Matsuda et al. |
| 6,157,864 A | | 12/2000 | Schwenke et al. |
| 6,161,054 A | | 12/2000 | Rosenthal et al. |
| 6,181,013 B1 | | 1/2001 | Liu et al. |
| 6,192,291 B1 | | 2/2001 | Kwon |
| 6,197,604 B1 | | 3/2001 | Miller et al. |
| 6,212,961 B1 | | 4/2001 | Dvir |
| 6,226,563 B1 | | 5/2001 | Lim |
| 6,228,280 B1 | | 5/2001 | Li et al. |
| 6,230,069 B1 | | 5/2001 | Campbell et al. |
| 6,236,903 B1 | | 5/2001 | Kim et al. |
| 6,237,050 B1 | | 5/2001 | Kim et al. |
| 6,245,581 B1 | | 6/2001 | Bonser et al. |
| 6,259,160 B1 | | 7/2001 | Lopatin et al. |
| 6,268,270 B1 | | 7/2001 | Scheid et al. |
| 6,277,014 B1 | | 8/2001 | Chen et al. |
| 6,281,127 B1 | | 8/2001 | Shue |
| 6,291,367 B1 | | 9/2001 | Kelkar |
| 6,303,395 B1 | | 10/2001 | Nulman |
| 6,317,643 B1 | | 11/2001 | Dmochowski |
| 6,339,727 B1 | | 1/2002 | Ladd |
| 6,346,426 B1 | | 2/2002 | Toprac et al. |
| 6,355,559 B1 | | 3/2002 | Havemann et al. |
| 6,363,294 B1 | | 3/2002 | Coronel et al. |
| 6,381,564 B1 | | 4/2002 | David et al. |
| 6,391,780 B1 | | 5/2002 | Shih et al. |
| 6,417,014 B1 | | 7/2002 | Lam et al. |
| 6,427,093 B1 | | 7/2002 | Toprac |
| 6,429,783 B1 | * | 8/2002 | Reyes et al. ............. 340/815.4 |
| 6,432,728 B1 | | 8/2002 | Tai et al. |
| 6,442,496 B1 | | 8/2002 | Pasadyn et al. |
| 6,449,524 B1 | | 9/2002 | Miller et al. |
| 6,455,415 B1 | | 9/2002 | Lopatin et al. |
| 6,465,263 B1 | | 10/2002 | Coss, Jr. et al. |
| 6,484,064 B1 | | 11/2002 | Campbell |
| 6,486,492 B1 | | 11/2002 | Su |
| 6,492,281 B1 | * | 12/2002 | Song et al. ................. 438/715 |
| 6,495,452 B1 | | 12/2002 | Shih |
| 6,515,368 B1 | | 2/2003 | Lopatin et al. |
| 6,517,414 B1 | | 2/2003 | Tobin et al. |
| 6,528,409 B1 | | 3/2003 | Lopatin et al. |
| 6,529,789 B1 | | 3/2003 | Campbell et al. |
| 6,532,555 B1 | | 3/2003 | Miller et al. |
| 6,535,783 B1 | | 3/2003 | Miller et al. |
| 6,537,912 B1 | | 3/2003 | Agarwal |
| 6,540,591 B1 | | 4/2003 | Pasadyn et al. |
| 6,541,401 B1 | | 4/2003 | Herner et al. |
| 6,546,508 B1 | | 4/2003 | Sonderman et al. |
| 6,556,881 B1 | | 4/2003 | Miller |
| 6,560,504 B1 | * | 5/2003 | Goodwin et al. ........... 700/121 |
| 6,580,958 B1 | | 6/2003 | Takano |
| 6,590,179 B2 | * | 7/2003 | Tanaka et al. ......... 219/121.43 |
| 6,604,012 B1 | * | 8/2003 | Cho et al. .................... 700/121 |
| 6,605,549 B2 | | 8/2003 | Leu et al. |
| 6,607,976 B2 | | 8/2003 | Chen et al. |
| 6,609,946 B1 | | 8/2003 | Tran |
| 6,616,513 B1 | | 9/2003 | Osterheld |
| 6,618,692 B2 | * | 9/2003 | Takahashi et al. .......... 702/188 |
| 6,624,075 B1 | | 9/2003 | Lopatin et al. |
| 6,625,497 B2 | | 9/2003 | Fairbairn et al. |
| 6,630,741 B1 | | 10/2003 | Lopatin et al. |
| 6,640,151 B1 | | 10/2003 | Somekh et al. |
| 6,652,355 B2 | | 11/2003 | Wiswesser et al. |
| 6,660,633 B1 | | 12/2003 | Lopatin et al. |
| 6,678,570 B1 | | 1/2004 | Pasadyn et al. |
| 6,708,074 B1 | | 3/2004 | Chi et al. |
| 6,708,075 B2 | | 3/2004 | Sonderman et al. |
| 6,725,402 B1 | | 4/2004 | Coss, Jr. et al. |
| 6,728,587 B2 | | 4/2004 | Goldman et al. |
| 6,735,492 B2 | | 5/2004 | Conrad et al. |
| 6,751,518 B1 | | 6/2004 | Sonderman et al. |
| 6,774,998 B1 | | 8/2004 | Wright et al. |
| 2001/0006873 A1 | | 7/2001 | Moore |
| 2001/0044667 A1 | * | 11/2001 | Nakano et al. ............. 700/100 |
| 2002/0165636 A1 | | 11/2002 | Hasan |
| 2002/0183986 A1 | | 12/2002 | Stewart et al. |
| 2002/0193899 A1 | | 12/2002 | Shanmugasundram et al. |
| 2003/0017256 A1 | | 1/2003 | Shimane |
| 2003/0154062 A1 | | 8/2003 | Daft et al. |

OTHER PUBLICATIONS

Oct. 1, 2004. International Preliminary Examination Report for PCT Ser. No. PCT/US03/23964.

Oct. 6, 2004. Office Action for U.S. Appl. No. 10/759,108, filed Jan. 20, 2004.

Oct. 12, 2004. International Preliminary Examination Report for PCT Ser. No. PCT/US02/19061.

Nov. 17, 2004. Written Opinion for PCT Ser. No. PCT/US01/27407.

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Jun. 20, 2002. Office Action for U.S. Appl. No. 09/619,044, filed Jul. 19, 2000.

Sep. 26, 2002. Office Action for U.S. Appl. No. 09/637,620, filed Aug. 11, 2000.

Oct. 23, 2002. Office Action for U.S. Appl. No. 09/469,227, filed Dec. 22, 1999.

Dec. 17, 2002. Office Action for U.S. Appl. No. 09/363,966, filed Jul. 29, 1999.

Feb. 10, 2003. Office Action for U.S. Appl. No. 09/619,044, filed Jul. 19, 2000.

Apr. 9, 2003. Office Action for U.S. Appl. No. 09/928,474, filed Aug. 14, 2001.

May 8, 2003. Office Action for U.S. Appl. No. 09/637,620, filed Aug. 11, 2000.

Jun. 18, 2003. Office Action for U.S. Appl. No. 09/655,542, filed Sep. 6, 2000.

Aug. 8, 2003. International Search Report for PCT/US03/08513.

Aug. 25, 2003. Office Action for U.S. Appl. No. 10/100,184, filed Mar. 19, 2002.

Sep. 15, 2003. Office Action for U.S. Appl. No. 09/928,474, filed Aug. 14, 2001.

Nov. 5, 2003. Office Action for U.S. Appl. No. 10/172,977, filed Jun. 18, 2002.

Dec. 1, 2003. Office Action for U.S. Appl. No. 10/173,108, filed Jun. 18, 2002.

Dec. 11, 2003. Office Action for U.S. Appl. No. 09/943,383, filed Aug. 31, 2001.

Dec. 16, 2003. International Search Report for PCT/US03/23964.

Jan. 23, 2004. International Search Report for PCT/US02/24860.

Feb. 2, 2004. Office Action for U.S. Appl. No. 09/363,966, filed Jul. 29, 1999.

IslamRaja, M. M., C. Chang, J.P. McVittie, M. A. Cappelli, and K. C. Saraswat. May/Jun. 1993. "Two Precursor Model for Low–Pressure Chemical Vapor Deposition of Silicon Dioxide from Tetraethylorthosilicate." *J. Vac. Sci. Technol. B.*, vol. 11, No. 3, pp. 720–726.

Kim. Eui Jung and William N. Gill. Jul. 1994. "Analytical Model for Chemical Vapor Deposition of $SiO_2$ Films Using Tetraethoxysliane and Ozone" (Abstract). *Journal of Crystal Growth*, vol. 140, Issues 3–4, pp. 315–326.

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16–17, 1998. "A Real–Time Equipment Monitoring and Fault Detection System." *Semiconductor Manufacturing Technology Workshop*, pp. 111–121.

Lantz, Mikkel. 1999. "Equipment and APC Integration at AMD with Workstream." *IEEE*, pp. 325–327.

Jul. 15, 2004. Office Action for U.S. Appl. No. 10/172,977, filed Jun. 18, 2002.

Aug. 2, 2004. Office Action for U.S. Appl. No. 10/174,377, filed Jun. 18, 2002.

Aug. 9, 2004. Written Opinion for PCT Ser. No. PCT/US02/19063.

Aug. 18, 2004. International Preliminary Examination Report for PCT Ser. No. PCT/US02/19116.

Aug. 24, 2004. Office Action for U.S. Appl. No. 10/135,405, filed May 1, 2002.

Aug. 25, 2004. Office Action for U.S. Appl. No. 09/998,384, filed Nov. 30, 2001.

Sep. 9, 2004. Written Opinion for PCT Ser. No. PCT Ser. No. PCT/US02/21942.

Sep. 16, 2004. International Preliminary Examination Report for PCT Ser. No. PCT/US02/24859.

Jul. 25, 2003. International Search Report for PCT/US02/24858.

Sun, S.C. 1998. "CVD and PVD Transition Metal Nitrides as Diffusion Barriers for Cu Metallization." *IEEE*. pp. 243–246.

Tagami, M., A. Furuya, T. Onodera, and Y. Hayashi. 1999. "Layered Ta–nitrides (LTN) Barrier Film by Power Swing Sputtering (PSS) Technique for MOCVD–Cu Damascene Interconnects." *IEEE*. pp. 635–638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I–PVD TA(N) Barrier in Dual Damascene" (Abstract). *Advanced Metallization Conference 2000*. San Diego, CA.

Eisenbraum, Eric, Oscar van der Straten, Yu Zhu, Katharine Dovidenko, and Alain Kaloyeros. 2001. "Atomic Layer Deposition (ALD) of Tantalum–Based Materials for Zero Thickness Copper Barrier Applications" (Abstract). *IEEE*. pp. 207–209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115–118.

Elers, Kai–Erik, Ville Saanila, Pekka J. Soininen, Wei–Min Li, Juhana T. Kostamo, Suvi Haukka, Jyriki Juhanoja, and Wim F.A. Besling. 2002. "Diffusion Barrier Deposition on a Copper Surface by Atomic Layer Deposition" (Abstract). *Advanced Materials*, vol. 14, No. 13–14, pp. 149–153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603–606.

Van der Straten, O., Y. Zhu, E. Eisenbraun, and A. Kaloyeros. 2002. "Thermal and Electrical Barrier Performance Testing of Ultrathin Atomic Layer Deposition Tantalum––Based Materials for Nanoscale Copper Metallization," *IEEE*. pp. 188–190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65–nm BEOL Technology." *IEEE*. pp. 595–598.

Mar. 30, 2004. Written Opinion for PCT/US02/19062.

Apr. 9, 2004. Written Opinion for PCT/US02/19116.

Apr. 22, 2004. Office Action for U.S. Appl. No. 09/998,372, filed Nov. 30, 2001.

Apr. 28, 2004. Written Opinion for PCT/US02/19117.

Apr. 29, 2004. Written Opinion for PCT/US02/19061.

May 5, 2004. Office Action for U.S. Appl. No. 09/943,955, filed Aug. 31, 2001.

May 5, 2004. International Preliminary Examination Report for PCT/US01/27406.

May 28, 2004. Office Action for U.S. Appl. No. 09/943,383, filed Aug. 31, 2001.

Jun. 3, 2004. Office Action for U.S. Appl. No. 09/928,474, filed Aug. 14, 2001.

Jun. 23, 2004. Office Action for U.S. Appl. No. 10/686,589, filed Oct. 17, 2003.

Jun. 30, 2004. Office Action for U.S. Ser. No. 09/800,980, filed Mar. 8, 2001.

Jul. 12, 2004. Office Action for U.S. Appl. No. 10/173,108, filed Jun. 8, 2002.

\* cited by examiner

801

| QoS - CpK | TOOL 1 | TOOL 2 | TOOL 3 | TOOL 4 |
|---|---|---|---|---|
| PROCESS SERVICES | | | | |
| PROCESS X | 2.35 | 2.1 | 2.16 | X |
| PROCESS Y | 3.41 | 3.03 | 3.21 | X |
| PROCESS Z | X | 4.19 | 4.21 | 4.16 |

FIG. 8

DYNAMIC CONTROL OF WAFER PROCESSING PATHS IN SEMICONDUCTOR MANUFACTURING PROCESSES

BACKGROUND OF THE INVENTION

1. Field of the Invention

The present invention relates to controlling semiconductor manufacturing processes, and, more specifically, to dynamically selecting semiconductor manufacturing tools and chambers to process a particular group of wafers based on information provided by the tools and chambers.

2. Related Art

In a conventional semiconductor manufacturing environment, a factory for manufacturing semiconductor products (e.g., microprocessors, memory units, logic units and the like) typically has a number of semiconductor processing tools, each of which performs one or more of a variety of semiconductor fabrication processing steps. For example, one tool may be configured to deposit a film (having a certain thickness) on a wafer, and another tool may be configured to etch away a layer from a wafer.

An example of a conventional semiconductor manufacturing factory as mentioned above is now described with regard to FIGS. 1–2. As first shown in FIG. 1, a conventional manufacturing factory 101 includes a controller 106, software applications 107 and a number of tools 1, 2, . . . , n, wherein "n" is an arbitrary integer. Although the controller 106 and the software applications 107 are shown as separate entities, the controller 106 can include one or more applications of the software applications 107. For the present purpose, it is sufficient to describe the controller 106 and software applications 107 as configured to control semiconductor manufacturing processing steps (e.g., instructing material moving machines to move wafers from one tool to another, instructing tools to process wafers in accordance with predefined recipes, etc.).

A typical tool is configured to process wafers (e.g., a layer deposition process, a layer etching process and the like) using one or more chambers. Chambers are typically where wafers are actually processed, and each can have a different function within a tool. For instance, one chamber of a tool can be configured to clean wafers and another chamber in the same tool can be configured to receive the cleaned wafers and deposit a layer of film on the wafer.

As wafers are processed by tools, the wafers are transported from one tool to another and processed therein until completed semiconductor products are fabricated. The controller 106 often stores trace information directed to which tools have processed which of the wafers. In some conventional embodiments, the wafers can be looped around to be processed two times or more by the same tool after being processed by other tools. In the parlance of semiconductor manufacturing, this is called a re-entry.

As the wafers are being transported around and processed by many different tools, the controller 106 is also configured to determine the status of its tools by receiving status information from the tools. This allows the controller 106 to decide which tools are operational and which are not. In turn, the controller 106 determines which tool to use for processing which lot of wafers.

A conventional tool typically uses some form of a binary flag signal to indicate whether the tool is operational or not. However, if one of the chambers belonging to a tool is not operational, the flag for that tool will be set to indicate that the entire tool is not operational, even if other chambers of the same tool are operational. Furthermore, each chamber often performs processing steps over a wide range of qualities. For example, a chamber may deposit layers precisely as anticipated when the tool is new or when it undergoes a maintenance process, but, over time, the performance of the chamber may degrade (e.g., a film layer of a deposition process may become less uniform). For the processing of certain wafers by that tool, a certain degree of degradation may be acceptable, while for processing other wafers, that same degree of degradation may not be acceptable. (For example, for certain types of semiconductor devices, low uniformity in the film layer will cause these devices to malfunction, while for other devices, the low uniformity will have no impact.) However, a decision must be made as to how degraded the tool performance must become before the flag indicating non-operational status is set. In effect, the flag can be set to meet only one standard of degradation (e.g., that of devices requiring no or little degradation, or that of devices where degradation has no impact.). Hence, although a chamber may be able to process wafers that can accept some degradation, if the flag is set to meet the higher standard, then the entire tool, not just the chamber, must be designated as not operational. These shortcomings of the conventional tools cause inefficient utilization of tool/chamber process resources.

In another aspect of conventional tools, the status information is set manually. For instance, the degree of degradation must be measured by an operator at certain intervals by evaluating processed wafers. The degree of degradation is then updated for that tool. The measuring, evaluating and updating processes by the operator consume time and are not cost effective.

Other shortcomings of conventional semiconductor manufacturing tools and environments are described by referring to FIG. 2, which shows various exemplary applications for the software applications 107. For instance, the software applications can include a number of service applications including: an operator certification application 201, tool operation application 203, data collection application 205, process planning application 207, activity costing application 209, parts management application 211, maintenance management application 213, total production management application 215, fabrication lab simulation application 217, supply chain planning application 219, process simulation application 221, and scheduling application 223. These are examples of software applications often used to operate a semiconductor manufacturing factory. For instance, the tool operation application 203 controls tools, the data collection application 205 collects appropriate data from various tools, and the parts management application 211 handles various parts of the tools and chambers to keep the resources operational.

Each of the software applications 107 includes its own "model" to represent the tools as shown in FIG. 2. This produces a number of shortcomings. First, since each application has its own model, integration of new software applications to the existing controller requires developing models for each of them. Second, when the tools are upgraded or new tools are integrated, many of the individual models are required to be updated, adjusted, and/or otherwise re-developed in order to accommodate the upgrade or the integration. These shortcomings cause delays and cost overruns common in the industry when integrating new tools or upgrading existing tools.

SUMMARY OF THE INVENTION

Embodiments of the present invention alleviates various shortcomings of the conventional technology described above by providing a system, method and medium for facilitating communication among tools in a semiconductor (e.g., a wafer) processing facility. In particular, the present invention provides a semiconductor fabrication system that includes a semiconductor fabrication tool and a software application, in communication with the semiconductor fabrication tool. The semiconductor fabrication tool includes a chamber configured to perform at least one process on a semiconductor wafer. The software application is configured to determine specified qualities of the first chamber in performing the at least one process. The specified qualities are directed to at least one of: a processing time required to perform the at least one process, a rate of producing defective output products of the at least one process, a uniformity of output products of the at least one process, and a capability index of the at least one process. Corresponding method and medium aspects of the invention are also envisioned by various embodiments of the present invention.

BRIEF DESCRIPTION OF THE DRAWINGS

Various objects, features, and attendant advantages of the present invention can be more fully appreciated as the same become better understood with reference to the following detailed description of the present invention when considered in connection with the accompanying drawings, in which:

FIG. 8 is a table illustrating quality of services information of a tool in at least some embodiments of the present invention;

DETAILED DESCRIPTION

Figure 3:
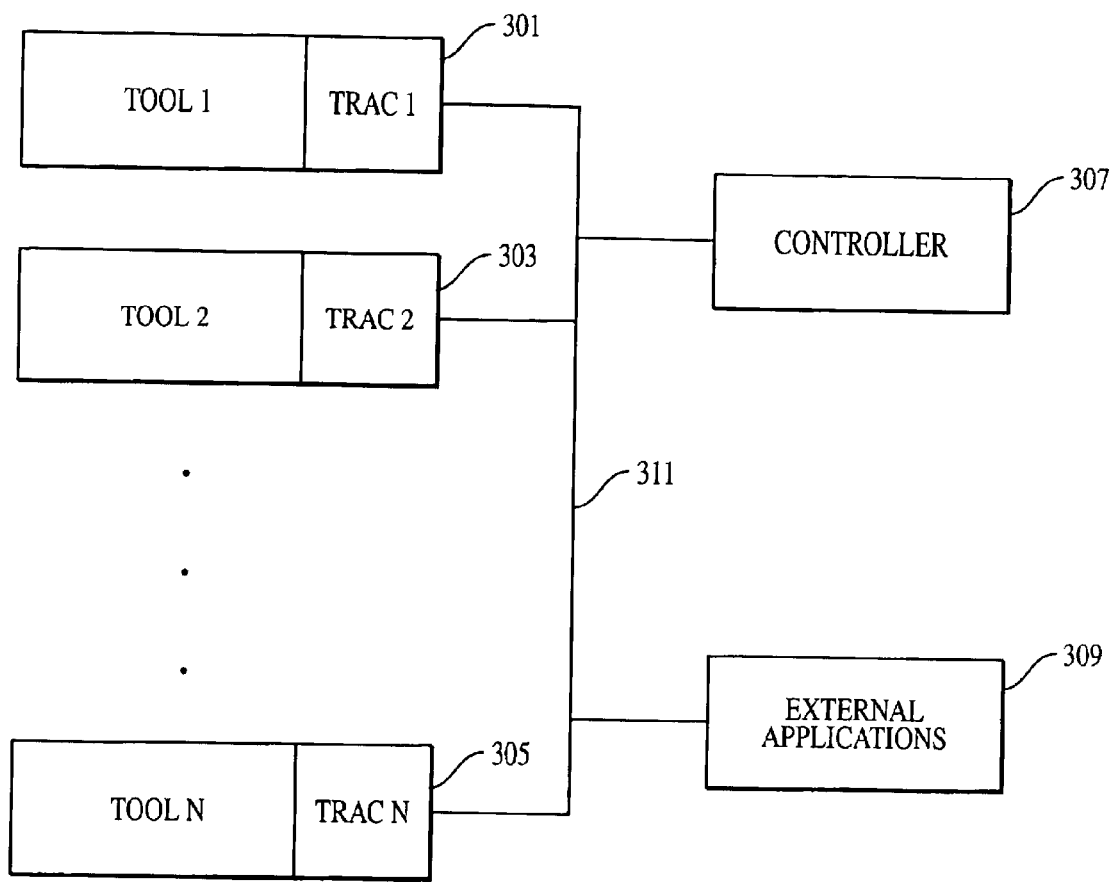
FIG. 3 is a schematic diagram of a collection of tools in at least some embodiments of the present invention.
Figure 11:
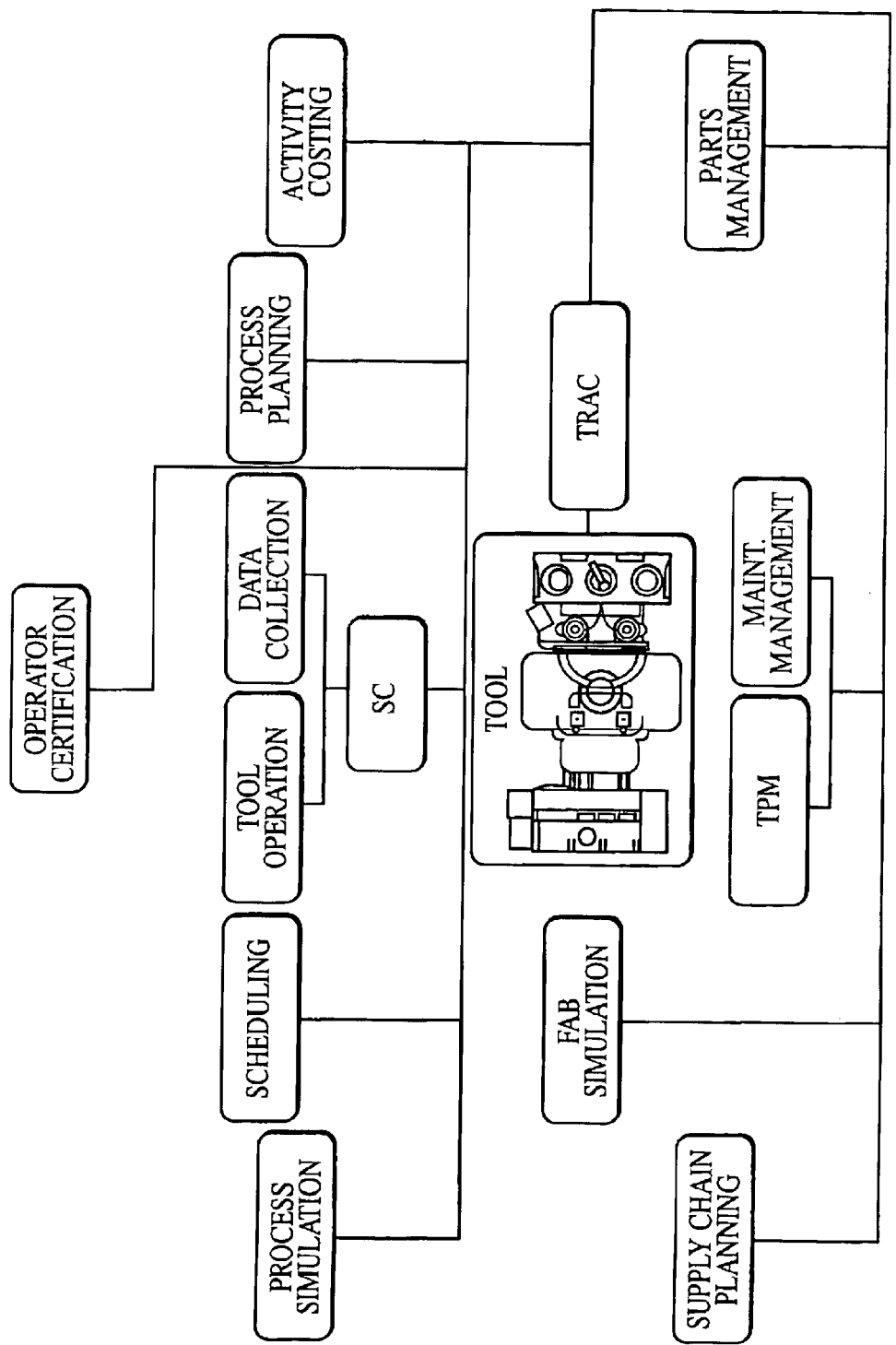
FIG. 11 is a schematic diagram illustrating external applications of at least some embodiments of the present invention.

A high-level system view of at least some embodiments of the present invention is depicted in FIG. 3. Referring now to FIG. 3, a Tool Representation and Access Control (TRAC) application is provided in conjunction with each of tools 301, 303, and 305. Specifically, a TRAC is a software application residing on a computer and is operatively in communication with (e.g., is connected to or is a part of) a tool. Each TRAC is configured to represent its associated tool by collecting and making accessible a tool's detailed status information relating to the tool and its chambers. Such detailed status information may include data relating to quality of service parameters, maintenance information and the like (discussed in greater detail below). The TRAC also allows external applications 309, examples of which are provided in connection with FIG. 11, to access the detailed status information using a standard communication protocol. Actual access to the detailed status information is controlled by the TRAC. Although a communication link 311 between the TRACs, controller 307 and external applications 309 are illustrated as having one physical wire connection, communication link 311 can include two or more communication channels. For example, a multi-channel communication link as known in the art (e.g., a frequency division multiplexing, a time division multiplexing or others) can be used. For instance, the communication link between the TRACs and the controller can be established using one channel while the communication link between the TRACs and the external applications can be established using another channel.

In at least some embodiments of the present invention, when an external application makes a request to access the detailed status information of a tool, the tool's TRAC determines which subset (or all) of the detailed status information can be accessed by the external application. Only the determined set of information is then allowed to be accessed by the external application. At least some embodiments of the present invention also envision that the TRAC is configured to receive a request to perform a process (e.g., wafers to be etched with certain qualifications, for example, to etch the wafers within a certain length of time) from an external application. The TRAC then directs its tool to perform the requested process by dynamically selecting which of one or more chambers belonging to the tool should perform the requested process. The selection of one or more chambers by the TRAC is determined dynamically based on the detailed status information of the chambers, as well as the requested qualifications of the process as dictated by the external application (e.g., that any selected chamber must be able to etch a wafer within a requested period of time).

Figure 12:
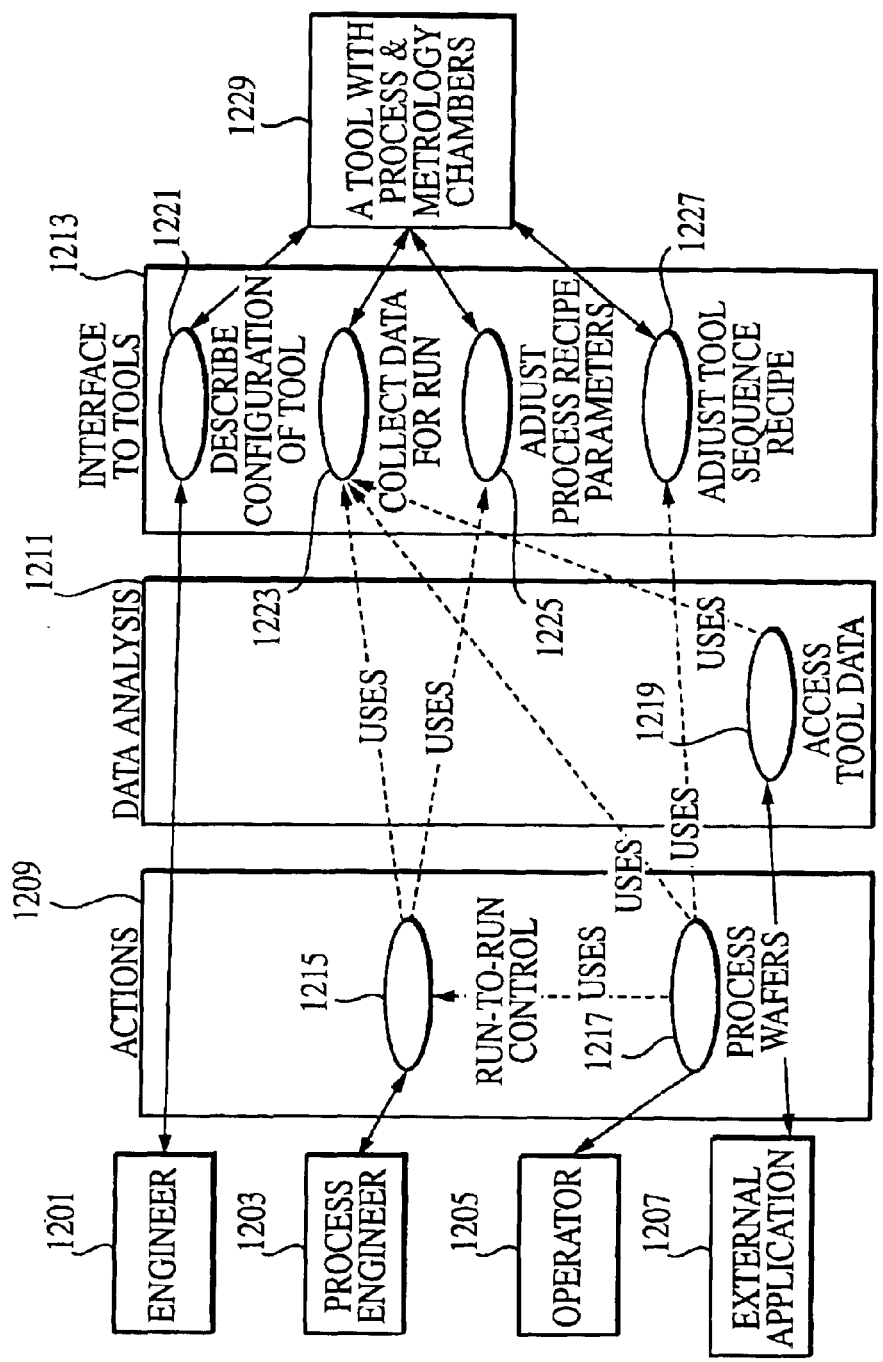
FIG. 12 is a data flow diagram of a collection of services for an initial setup for a tool in at least some embodiments of the present invention.
Figure 13:
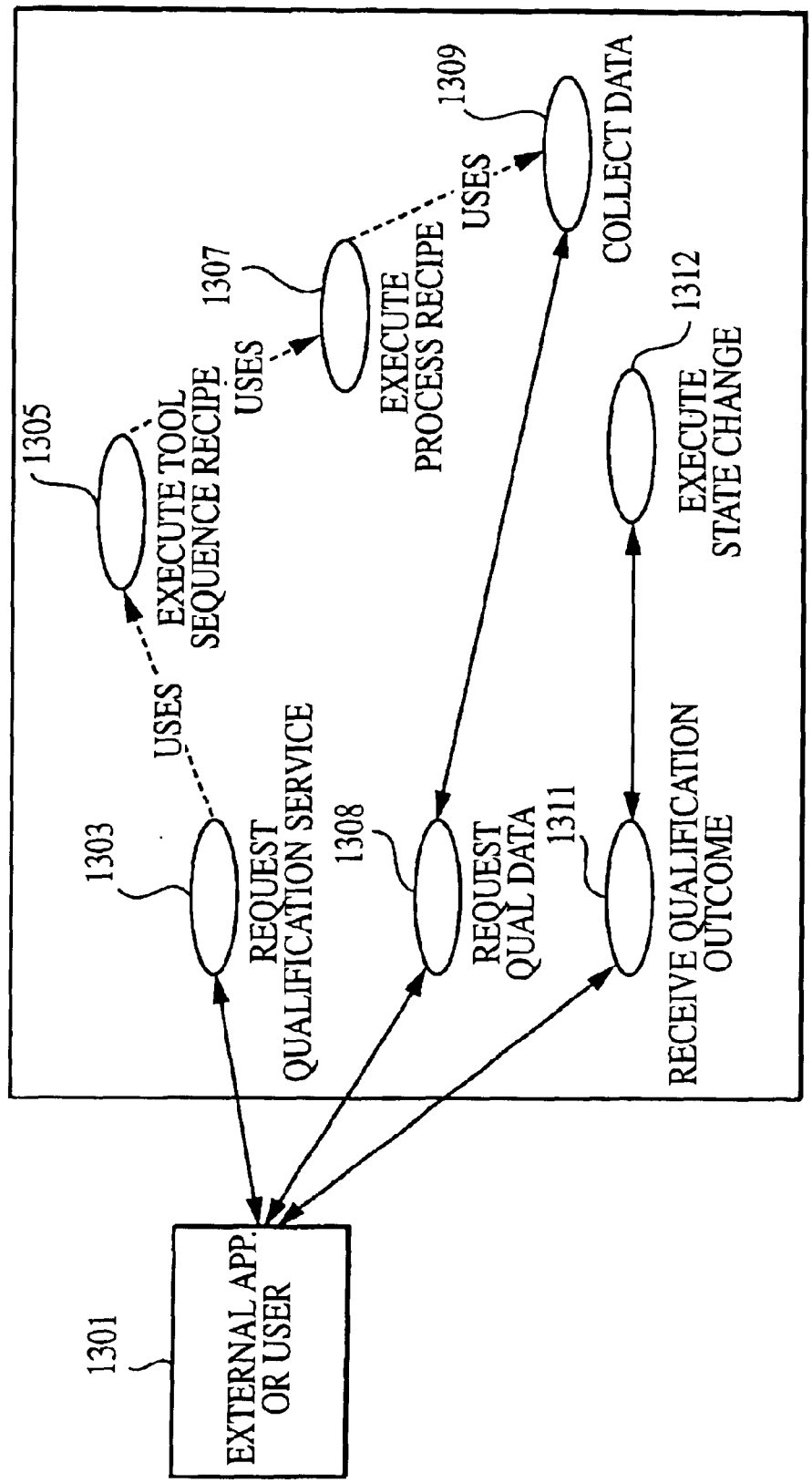
FIG. 13 is a data flow diagram of a collection of services for a qualification request of a tool in at least some embodiments of the present invention.
Figure 14:
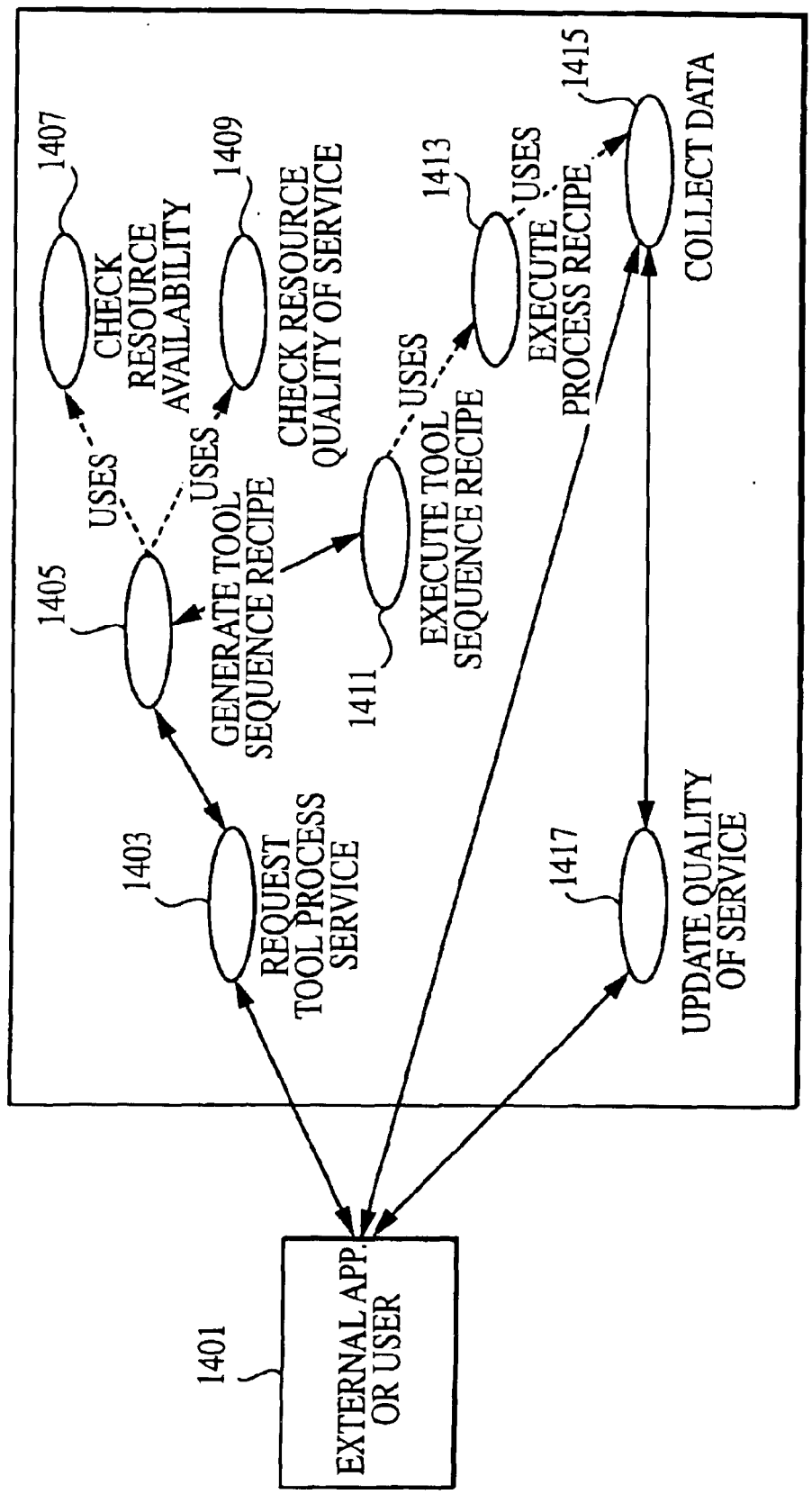
FIG. 14 is a data flow diagram of a collection of services for a wafer processing of a tool in at least some embodiments of the present invention.
Figure 16A:
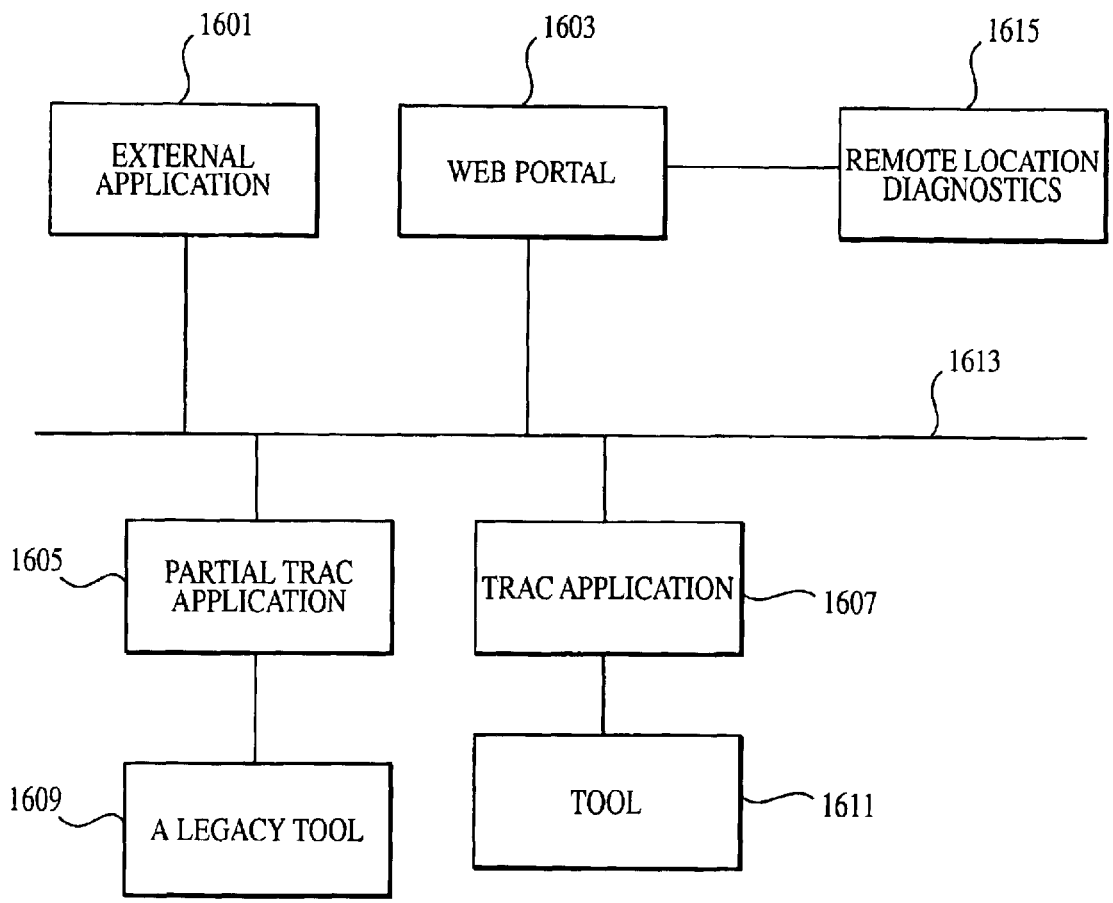
FIG. 16(a) is a block diagram illustrating a partial TRAC and a TRAC in at least some embodiments of the present invention.
Figure 17:
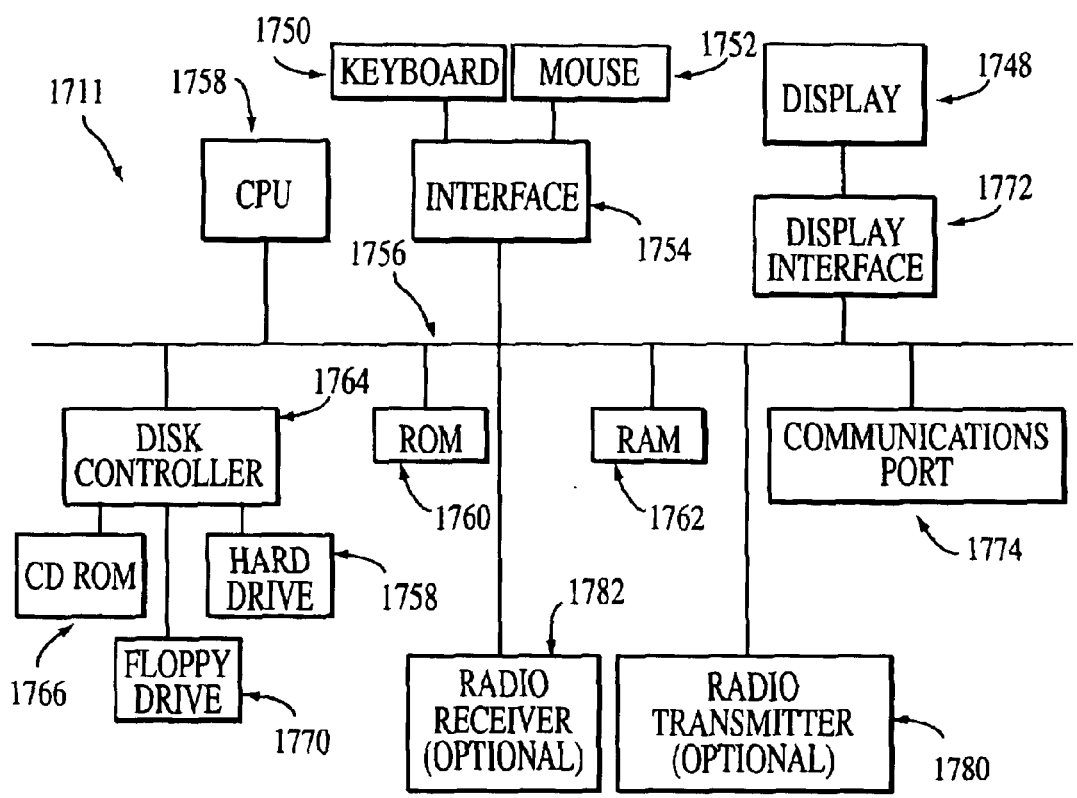
FIG. 17 is a block diagram of a computer system that includes a TRAC according to at least some embodiments of the present invention.
Figure 18:
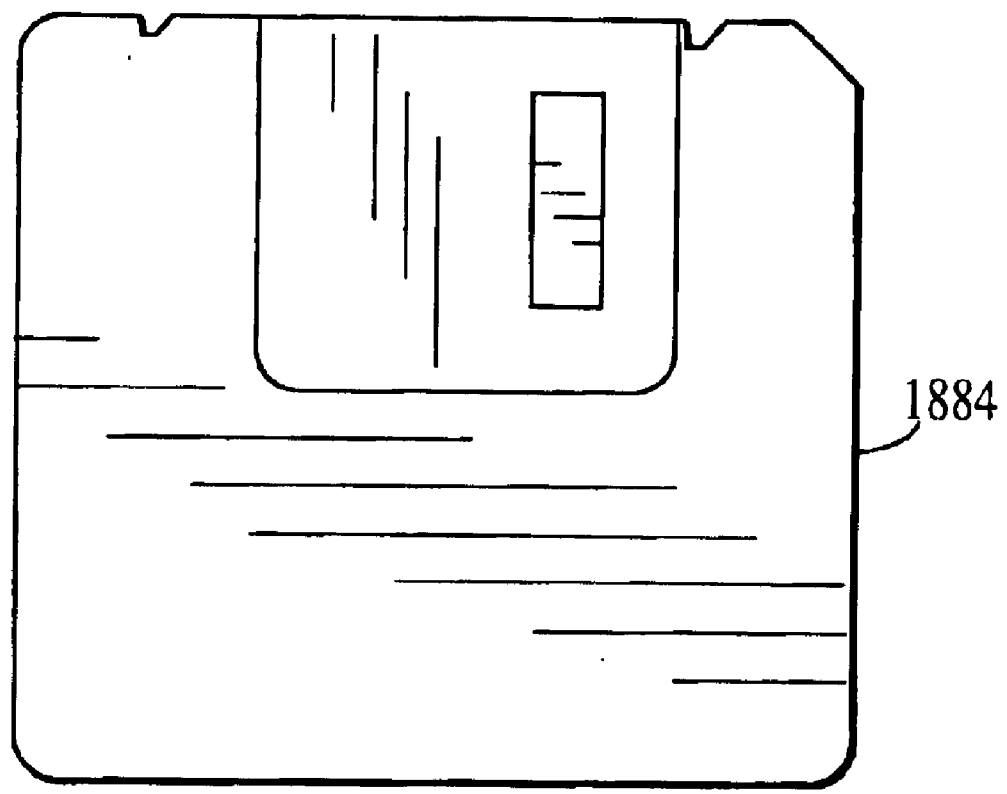
FIG. 18 is a diagram illustrating a floppy disk that may store various portions of the software according to at least some embodiments of the present invention.

These and other features of the present invention are now described in greater detail by referring to an exemplary hardware configuration of a tool having three process chambers (FIG. 4), detailed status information (FIGS. 5–8), overall software architecture of the TRAC (FIG. 9), data I/O messages of the TRAC (FIG. 10), external applications and the TRAC (FIG. 11), and software functional data flow diagrams showing how various services requested by external applications are performed by the TRAC (FIGS. 12–14). Other descriptions include various configurations between a TRAC and a legacy tool (FIG. 16(a)) and between tools and TRACs (FIG. 16(b)). An exemplary computer system that a TRAC may reside in and operate thereon and/or be a part of an environment relating thereto is also described. (FIGS. 17–18).

Figure 4:
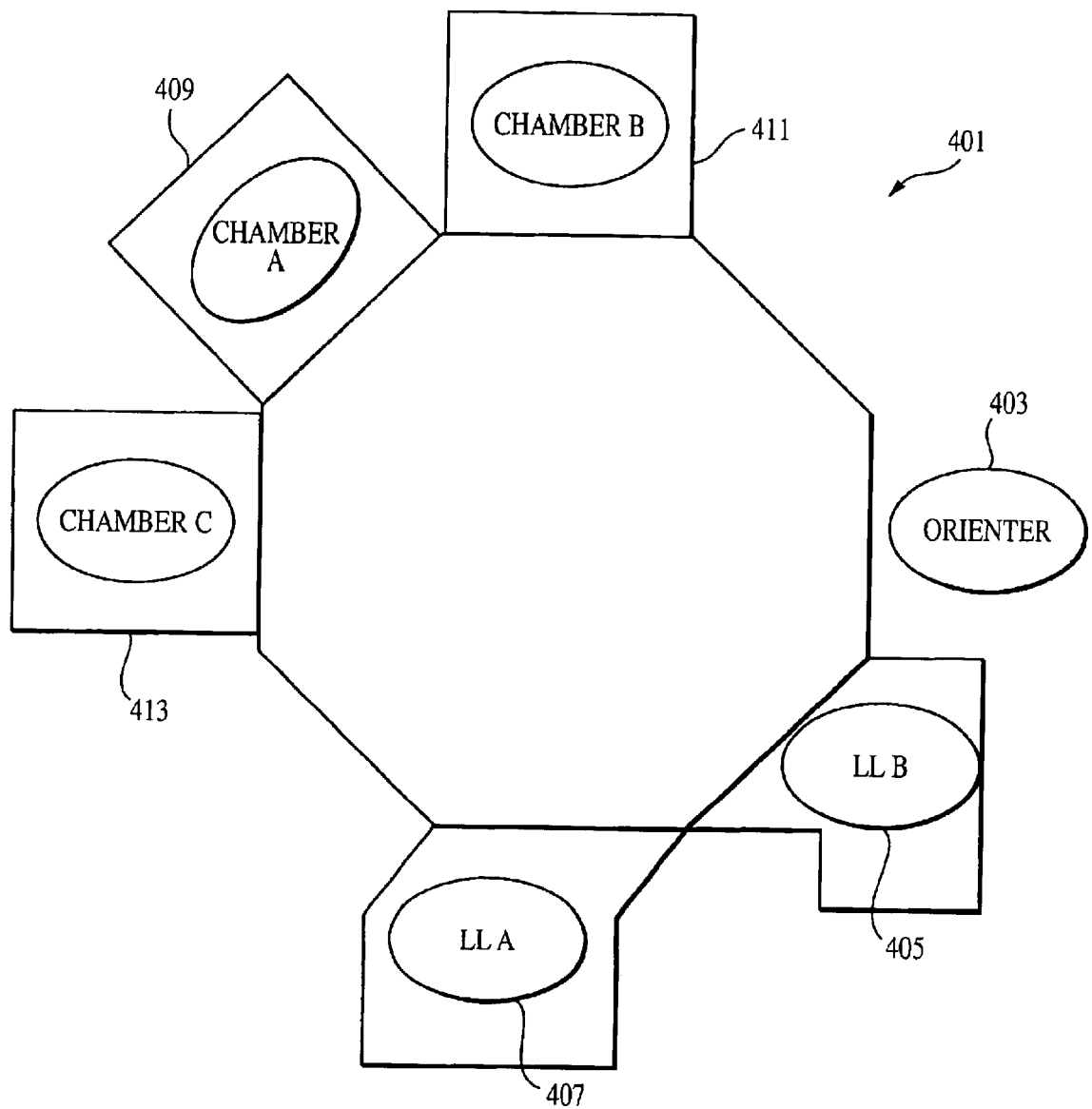
FIG. 4 is a schematic diagram of an exemplary tool used in at least some embodiments of the present invention.

First, turning to FIG. 4, an example of a tool (e.g., the CENTURA family of tools developed and manufactured by Applied Materials, Inc. of Santa Clara, Calif.) and its various components that can be used with and/or as part of at least some embodiments of the present invention are now described. As shown in FIG. 4, a tool 401 includes an orienter 403, load locks 405, 407 and a number of chambers 409, 411, 413 that are vacuum connected together creating a sealed environment to process wafers. The orienter 403 is a device to move material (e.g., wafers) between the chambers, load locks and other components of the tool. The load locks 405, 407 are configured to preserve the vacuum within the tool 401, while allowing the tool 401 to receive wafers to be processed and then output the processed wafers.

As noted above, a tool may include any number of process chambers (e.g., three process chambers, Chamber A 409, Chamber B 411, Chamber C 413, in the embodiment illustrated in FIG. 4). Thus, the tool 401 may be configured to deposit a layer of film having a certain thickness such that Chamber A 409 cleans the wafer (e.g., etching away a layer) received by the tool 401, Chamber B 411 deposits the layer, and Chamber C 413 measures the thickness of the layer deposited on the wafers. This particular example of a configuration and sequence will be used in discussing various embodiments of the present invention. It should be noted, however, that tools used with the various embodiments of the present invention may include any number of chambers and each chamber may be configured to perform any number of various semiconductor processing steps.

Before turning to describe other aspects of the present invention, two terms (a process recipe and sequence recipe) are described. A "process recipe" refers to one or more semiconductor manufacturing steps that a chamber is configured to perform. When a process recipe is performed by a chamber, the chamber can be said to have performed a process defined by the process recipe (i.e., the process is implemented by the constituent steps of the process recipe). Accordingly, a process recipe defines chamber control parameters (e.g., RF power, electrode spacing, gas pressure, SiH4 flow, and N2O flow) for a particular process.

A "sequence recipe", on the other hand, refers to a list of process recipes that a lot of wafers are to undergo within a tool. A tool and its chambers may be configured to perform number of different process and sequence recipes. When a sequence recipe is performed by a chamber, the chamber can be said to have performed a process defined by the sequence recipe.

It should be noted that whether a process is referring to performing a process recipe or a sequence recipe will depend upon the context in which the term process is used. In some instances, a process can be referring to performing one or both of a process recipe and a sequence recipe.

In at least some embodiments of the present invention, the tool can be subjected to a "qualification" job process by an external application to be qualified (e.g., evaluated and certified) to perform one or more specified process and/or sequence recipes among those process and/or sequence recipes that the tool is configured (i.e., has the ability) to perform. More specifically, at least certain detailed status information from a tool is obtained and evaluated to determine whether the tool is fit (under a given set of circumstances) to perform one or more specified processes of specified process and/or sequence recipes. It should be noted that in at least some embodiments of the present invention the outcome of the qualification job process can be expressed in terms of the data collected (e.g., the time required to complete a process) and/or can be expressed in a binary form simply indicating whether the tool is qualified or not for the specified process and/or sequence recipes.

Figure 5:
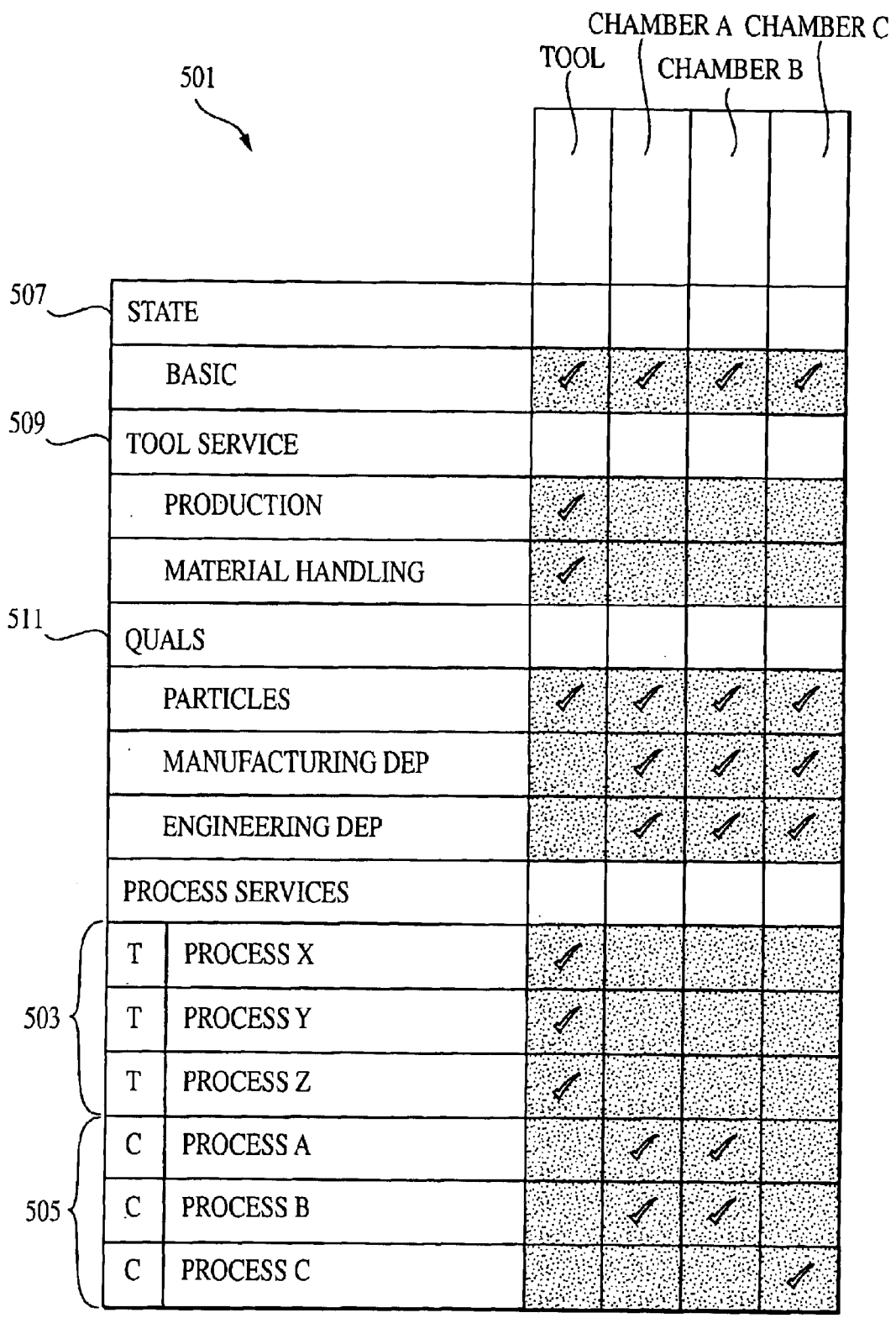
FIG. 5 is a table illustrating tool level status information in at least some embodiments of the present invention.

Examples of the above-introduced various embodiments are described in connection with FIGS. 5–8 (501, 601, 701, 801). Referring first to FIG. 5, this figure illustrates examples of processes 505 implemented by process recipes (which can be thought of as chamber level processes), and processes 503 implemented by sequence recipes (which can be thought of as tool level processes), that an exemplary tool may be qualified to perform. In the example of FIG. 5, check marks indicate qualifications (e.g., the binary form discussed above). In particular, in this example embodiment, the tool can be configured (and is qualified) to perform tool level Processes X, Y and Z (which may be processes to, e.g., deposit layers with different thickness and/or to clean wafers) as shown at 503. In addition, at the chamber level, FIG. 5 indicates that Chambers A and B are qualified to perform Processes A and B, while only Chamber C can be configured (and qualified) to perform Process C, as shown at 505. Again, the processes that Processes A, B and C represent can be any number of different types of processes, including processes for cleaning, etching and/or measuring.

The above-described qualification information (relating to whether a tool/chamber can be configured and qualified to perform a particular set of processes) can form a part of the detailed status information provided to external applications and can be used to select one or more appropriate chambers by the TRAC. Also, in at least some embodiments of the present invention, the detailed status information may include the following additional information relating to states of the tool and its chambers 507, tools service 509, and quals (i.e., qualification levels) 511.

The additional detailed status information is now described in greater detail. Specifically, the information relating to the state status of the tools and its chambers 507 relates to the basic states (on or off) of the tool and each of its chambers. The information relating to the tool service 509 includes information relating to production and material handling.

In the example shown in FIG. 5, the tool and its chambers are all indicated as operational by check marks for the information relating to the state 507. In addition, the tool is qualified for production as well as material handling.

The information relating to the quals 511 are directed to, for example, Particles, Manufacturing Dep (Deposition) and Engineering Dep (deposition). In particular, the status information directed to Particles relates to the number of unwanted particles that were introduced into produced wafers as they are processed by a particular tool or a chamber. For instance, when wafers are processed through a chamber, a metrology device chamber can then determine how many unwanted particles have been introduced by the process of the chamber. The number of introduced particles determined by the metrology chamber is then compared with a threshold value (e.g., a nominal target). If the number of introduced particles is below the threshold value, then the chamber is determined to be qualified. If the number of introduced particles is above the threshold value, then the chamber is determined not to be qualified. The above example of using a threshold to determine the status information directed to Particles is provided only for illustrative purposes. Other methods of determining the status information are also contemplated within embodiments of the present invention.

Manufacturing Dep is designated as qualified if a manufacturing level deposition can be achieved. Engineering Dep is designated as qualified, if an engineering level quality of deposition is achieved. The engineering level of quality is lower than the manufacturing level, since the manufacturing level requires a more accurate output product. Note that a tool may be determined to be qualified to perform Manufacturing Dep and/or Engineering Dep. Depending upon the precise situation and definition applied to the terms, it may be the case that if a tool is qualified perform to the Manufacturing Dep, then the tool may be used to perform depositions on production wafers. Whereas, if a tool is qualified to perform only the Engineering Dep, then the tool may be used to perform depositions on trial or experimental wafers only.

In the example shown in FIG. 5, it can be seen that the tool and chambers A, B and C are qualified for Particles, and chambers A, B and C are qualified for both Manufacturing Dep and Engineering Dep.

At least some embodiments of the present invention include obtaining and providing additional detailed status information in the form of "quality of service" parameters relating to the processes that are implemented. The quality of services parameters may be values that can be calculated for each chamber and/or each tool.

In at least some embodiments of the present invention, the quality of service parameters can be used in determining the qualifications of tools and chambers. It is envisioned that the quality of service parameters can, for example, include: the time required to complete a process, the uniformity of wafers processed, the value of a capability index (e.g., Cpk), the number of wafers that are defectively produced and SPC (Statistical Process Control). These example parameters are now described in greater detail below.

The time required to complete a process relates to the average time elapsed to process a lot of wafers. For instance, the average time to deposit a layer of film on a wafer in a lot of fifty wafers may be 46 seconds.

The uniformity parameter relates to the variability within one wafer. For instance, if 100 nm is to be deposited on a wafer, the thickness of the layer is measured on various points of the wafer. The uniformity is the average value of the measurements that vary from the target and is expressed in terms of %.

The Cpk parameter can be calculated using the following exemplary equations:

$Cpk = Zmin/3$ $Zmin =$ smaller of Zupper or Zlower $Zupper = [(USL-\text{Mean})/\text{Estimated sigma}]$ $Zlower = [(\text{Mean}-LSL)/\text{Estimated sigma}]$ Estimated sigma = average range/$d2$ $d2$ = a number defined by standard statistical tables, which are well known to one skilled in the art, in connection with a number of measurements made per sample 'n' (e.g., $d2=1.693$ when $n=3$) USL=Upper specification limit LSL=Lower specification limit Generally speaking, a chamber with a high Cpk value performs its processes more accurately than a chamber with a lower Cpk Value. That is, as the process improves, the Cpk value increases.

The defectivity parameter measures the number of defects caused by the process per a unit area (e.g., 0.03 def/cm2).

The SPC parameter is a technique that identifies an abnormal source of errors. For instance, by continuously making measurement, a constant, predictable source of error can be identified; however, in some instances there are spikes in the measurements where the source of the error may not be constant. The SPC parameter identifies when such errors occur.

The above-listed quality of service parameters are provided as examples and do not represent an exhaustive list of possible quality of service parameters. Other similar parameters that can characterize the status of chambers and/or tools can also be used in conjunction with at least some embodiments of the present invention.

Figure 6:
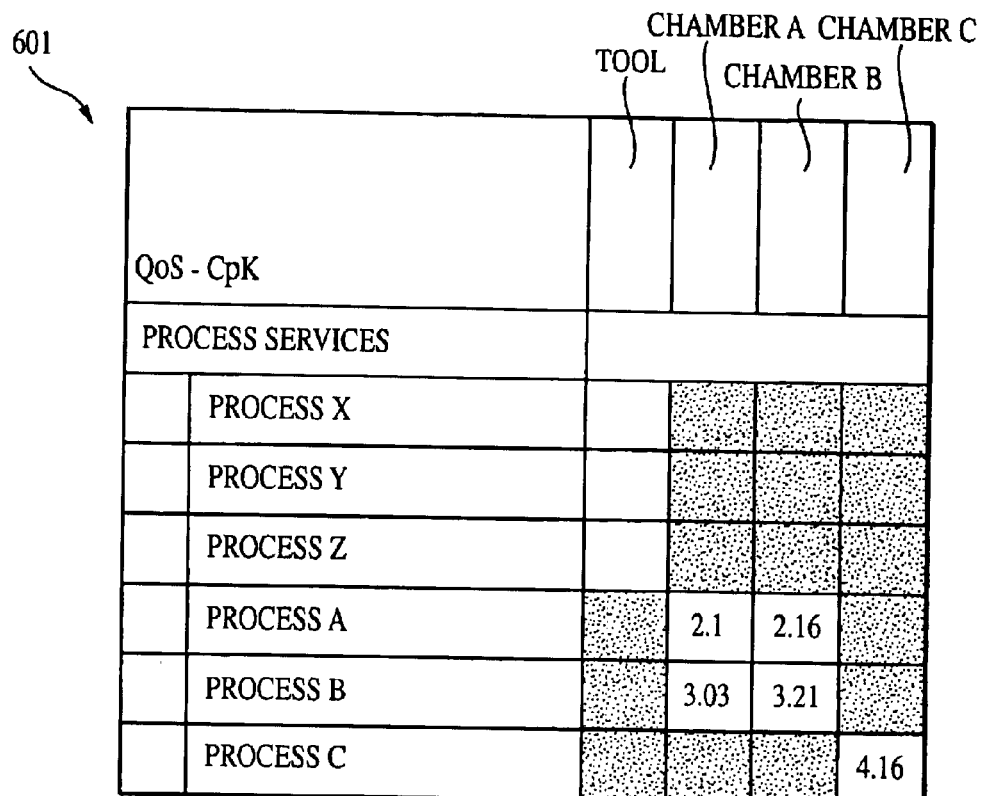
FIGS. 6–7 are tables illustrating quality of service information of chambers in at least some embodiments of the present invention.
Figure 7:
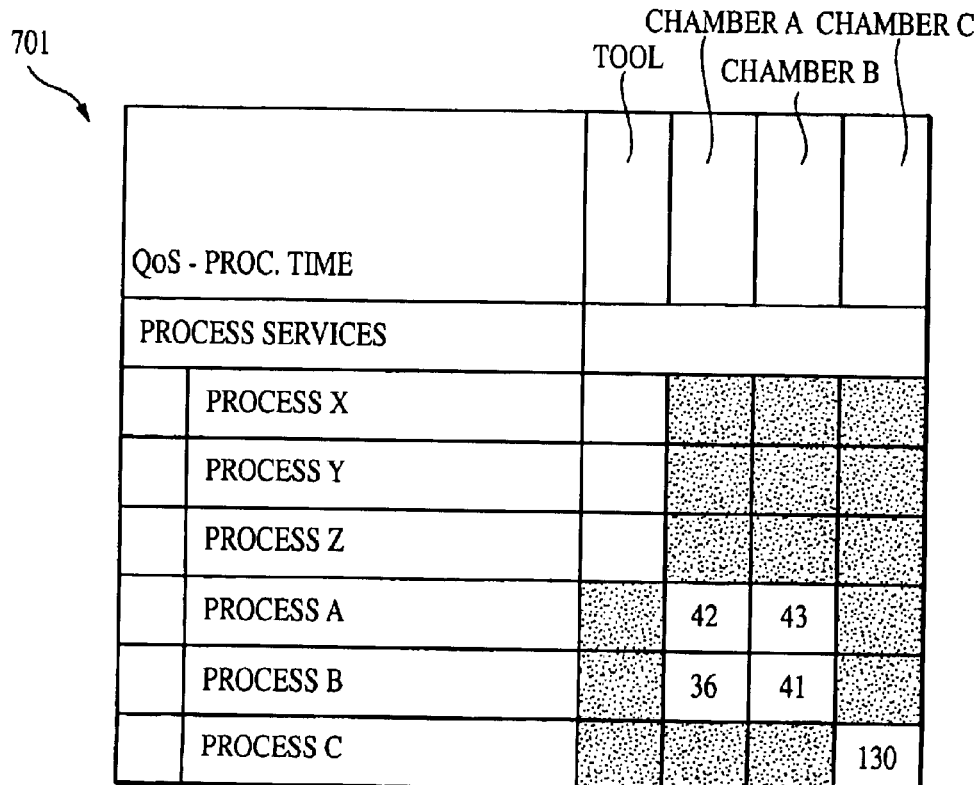

In continuing to describe the quality of services parameters, two example tables are provided for the chamber level parameters (FIGS. 6–7) and one example table is provided for tool level parameters (FIG. 8). Referring first to FIG. 6, and with regard to the Cpk parameter, it is shown that Chamber A has the Cpk value of 2.1 for Process A and 3.03 for Process B, Chamber B has CPK value of 2.16 for Process A and 3.21 for Process B, and Chamber C has Cpk value of 4.16 for Process C. Referring to FIG. 7, it is shown that Chamber A takes 42 seconds to complete Process A and takes 36 seconds to complete Process B, Chamber B takes 43 seconds to complete Process A and takes 41 seconds to complete Process B, and Chamber C takes 130 seconds to complete Process C. In this example, there is no choice but to use Chamber C if Process C is required.

Using the above-described status information relating to the quality of service parameters, a qualification job can determine which of the chambers are qualified for which processes. For example, if a minimum of 2.1 for the Cpk is required for Process A, then only Chamber B is qualified for it. If a minimum of 2.0 for the Cpk is required for Process A, then both Chambers A and B are qualified for it. A similar determination process can also be applied to other quality of service parameters (each separately or in any combination thereof).

When multiple chambers are qualified for a process, one of the qualified chambers can ultimately be selected by the TRAC to perform a process on wafers by considering the various available information and criteria at issue. For instance, in view of the numerical value of FIGS. 6 and 7, when both Chamber A and B have been qualified, and if Process B is to be performed and quality is more important than the time it takes a chamber to complete the process, then Chamber B is selected. This is because Chamber B produces wafers with the Cpk value of 3.21. This is in contrast with Chamber A, which produces lower quality wafers (at the Cpk value of 3.03). However, if time is more crucial than the quality, then Chamber A would be selected (since Chamber A takes 36 seconds, whereas Chamber B takes 41 seconds). Similar selections can be performed for Process A. Although, in the above example, only time and quality are compared with each other, all five or a combination of those parameters (or other parameters which have not been specifically mentioned) can be compared with each other to select the chamber that is best fit to perform certain processes under certain circumstances.

The above-described qualification and selection steps can also be extended to tools. For example, and referring to FIG.

8, the tool level services can also have a set of quality of service parameters assigned to them. In the example shown in FIG. 8, various Cpk values have been determined for a number of tools. In particular, Tool 1 is determined to have the Cpk value of 2.35 for Process X and 3.41 for Process Y; Tool 2 is determined to have the Cpk value of 2.1 for Process X, 3.03 for Process Y and 4.19 for Process Z; Tool 3 is determined to have the Cpk value of 2.16 for Process X, 3.21 for Process Y and 4.21 for Process Z; and Tool 4 is determined to have the Cpk value of 4.16 for Process Z. In the example, if Process Y is to be performed and the Cpk value of at least 3.20 is required, then Tool 1 and Tool 3 are qualified. One of Tool 1 and Tool 3 can then be selected using similar steps as described above in connection with selecting chambers. It should be noted that, although only Cpk and process times for chambers and Cpk for tools are shown in FIGS. 6–8, similar qualification and selection steps are applicable to other quality of service parameters.

Figure 9:
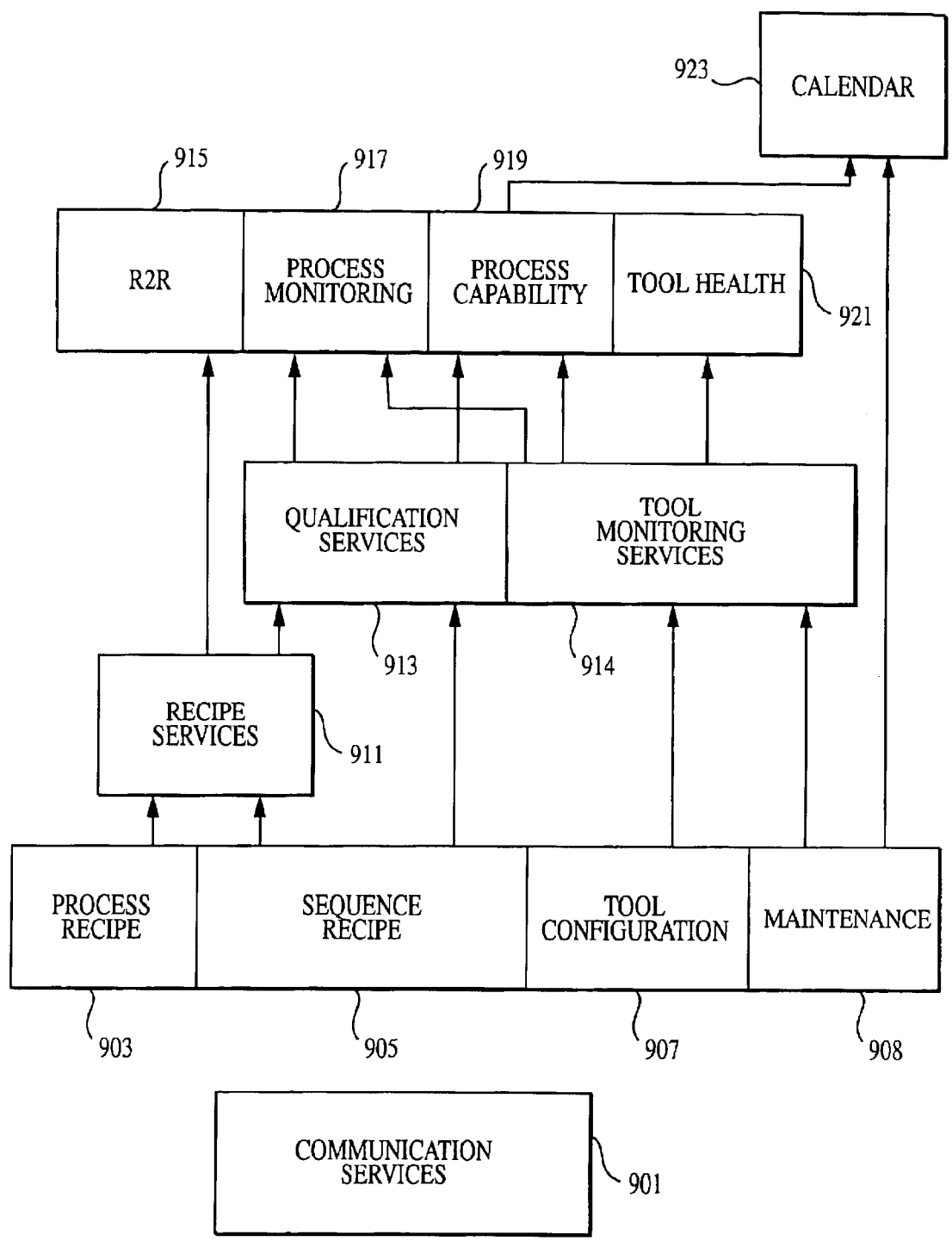
FIG. 9 is a schematic diagram illustrating an internal software architecture of at least some embodiments of the present invention.

Various software applications to perform the above-described features in at least some embodiments of the present invention are now described by referring to FIG. 9. Specifically, FIG. 9 illustrates an example of an internal software architecture of the TRAC, which includes the following internal applications: a communication services application 901, a process recipe application 903, a sequence recipe application 905, a tool configuration application 907, a maintenance application 908, a recipe services application 911, a qualification application 913, a tool monitoring services application 914, a Run to Run (R2R) application 915, a process monitoring application 917, a process capability application 919, a tool health application 921, and a calendar application 923.

More specifically, the communication services application 901 is configured to manage input output (I/O) data streams between the TRAC and external applications. The process recipe application 903 manages process recipes to control chambers. As noted above, a process recipe specifies chamber control parameters (e.g., RF power, electrode spacing, gas pressure, $SiH_4$ flow, and $N_2O$ flow). The sequence recipe application 905 handles sequence recipes which define which chambers to use for what process for the entire tool. For instance, the sequence recipe may define Chamber A to clean a lot of wafers (e.g., etch) and Chamber B to deposit a layer with a certain thickness. In this example, a process recipe associated with Chamber A would define appropriate control parameters to perform the process of cleaning the lot of wafers. Similarly, a process recipe associated with Chamber B would define appropriate control parameters to perform the process of depositing the layer with a certain thickness on the cleaned lot of wafers.

The tool configuration application 907 manages configuring various elements of its tools (e.g., chambers, load locks and orienters). The maintenance application 908 manages maintenance related information (e.g., a maintenance schedule).

The above-mentioned applications (the process recipe 903, sequence recipe 905, tool configuration 907, maintenance 908 applications) can be leveraged to build (e.g., its constituent parts or services used to effectively functionally create) other internal applications illustrated in FIG. 9. In particular, the recipe services application 911 can provide services relating to all recipes by leveraging the services of the process recipe 903 and sequence recipe 905 applications. The tool monitoring services application 914 can provide services relating to overall monitoring of the tool by leveraging the services of the tool configuration 907 and maintenance 908 applications. The qualification services application 913 is configured to provide services relating to qualifying the tool by building on the services provided by the recipe services 911 and the sequence recipe 905 applications. The R2R 915, processing monitoring 917, process capability 919 and tool health 921 applications provide various services built on the services provided by the recipe services 911, qualification services 913, and tool monitoring services 914 applications as illustrated in FIG. 9. Various services provided by the internal software applications mentioned above as contemplated by at least some embodiments of the present invention will be described in connection with FIGS. 12–14 below.

Figure 10:
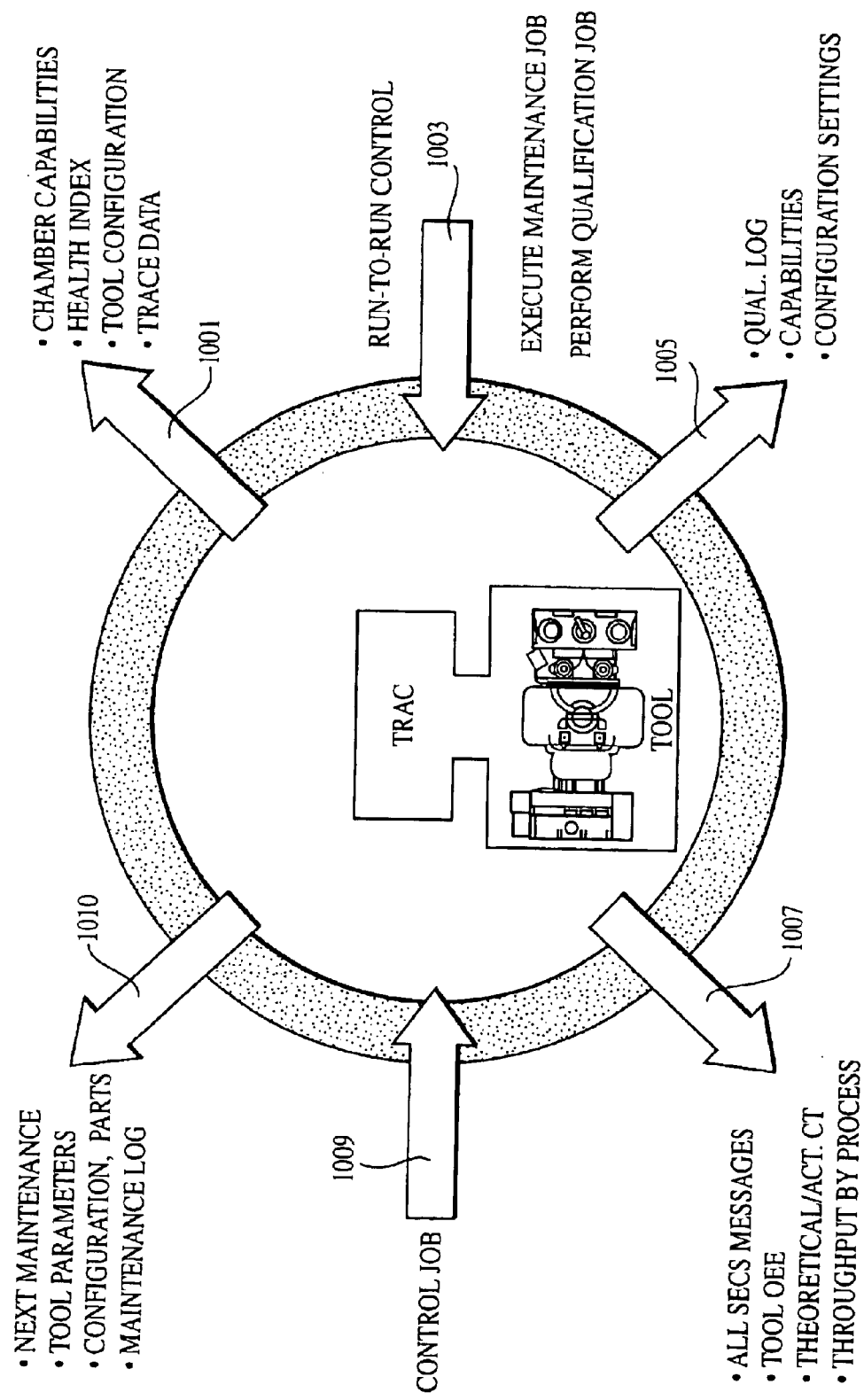
FIG. 10 is a schematic diagram illustrating I/O messages in at least some embodiments of the present invention.

Using the above-mentioned applications, various input and output data can be exchanged between a TRAC and external applications. FIG. 10 depicts examples of the input-output data of the TRAC. From the TRAC, information relating to chamber capabilities, health index, tool configuration and trace data can be "exposed" 1001 to external applications using the services provided by the various internal applications using a standard communications protocol, (e.g., Hypertext Transfer protocol, HTTP, Extended Markup Language, XML, Semi-conductor Communications Standard, SECS, or the like). The TRAC can also be asked 1003 to conduct maintenance jobs and qualification jobs, which may be performed by the maintenance and qualification applications (908, 913), respectively. The run-to-run control service request can be handled by the R2R application (915).

After performing a qualification job, information relating to quality log, capabilities, configuration, and settings may be generated and stored into memory locations in the TRAC, which then can be exposed 1005 to external applications. A qualification job may involve processing a lot of wafers through the tool and measuring the processed lot of wafers in a metrology chamber and then calculating corresponding quality of service parameters (e.g., Cpk) based on the measurements. It should be noted that, in at least some embodiments of the present invention, a metrology chamber can be included in the tool, in order to represent and obtain information about the tool, in communication with the TRAC, or can be included in another tool. When the metrology chamber is in another tool, the processed wafers are transported to the tool with the metrology chamber and the necessary measurements are performed in that tool. Relevant information collected by the tool with the metrology chamber can then be transmitted to the TRAC that is in communication with the tool that processed the wafers (e.g., as shown below in connection with FIG. 16(b)). A qualification job can be initiated when, e.g., a tool comes on-line, new wafers are processed through the tool, a new process recipe is performed at any of the chambers of the tool, a new sequence recipe is performed by the tool, a maintenance service is performed on the tools, and/or the tool is cleaned. It should also be noted that a qualification job can be initiated by an external application.

The TRAC of at least some embodiments of the present invention is also capable of sending messages 1007 using a standard communications protocol (e.g., SECS). The TRAC can also send OEE messages, (Overall Equipment Effectivity), which relates to the tool's operational availability (specifically, the length of time the tool has been available to be used vs. the length of time the tool has been down for maintenance). The TRAC also can output messages relating to theoretical and actual cycle time of the tool, and output information relating to throughput when a lot of wafers are actually processed.

It is further envisioned that the TRAC can receive a control job message 1009. A control job message is a set of commands sent to the TRAC to process a certain lot of wafers. The TRAC then parses out the commands and instructs the tool, and its chambers, to process the lot of wafers by using the process and sequence recipe applications (903, 905). If multiple chambers are qualified to perform the job, then the TRAC dynamically selects which chamber(s) is actually to perform the job in conjunction with various criteria and information as discussed above (e.g., in connection with the concepts of FIGS. 6–7).

With respect to the maintenance of the tool, the TRAC also can expose 1010 information relating to when the next maintenance activity should take place, as well as information relating to tool parameters, configuration and parts, and maintenance logs.

Figure 1:
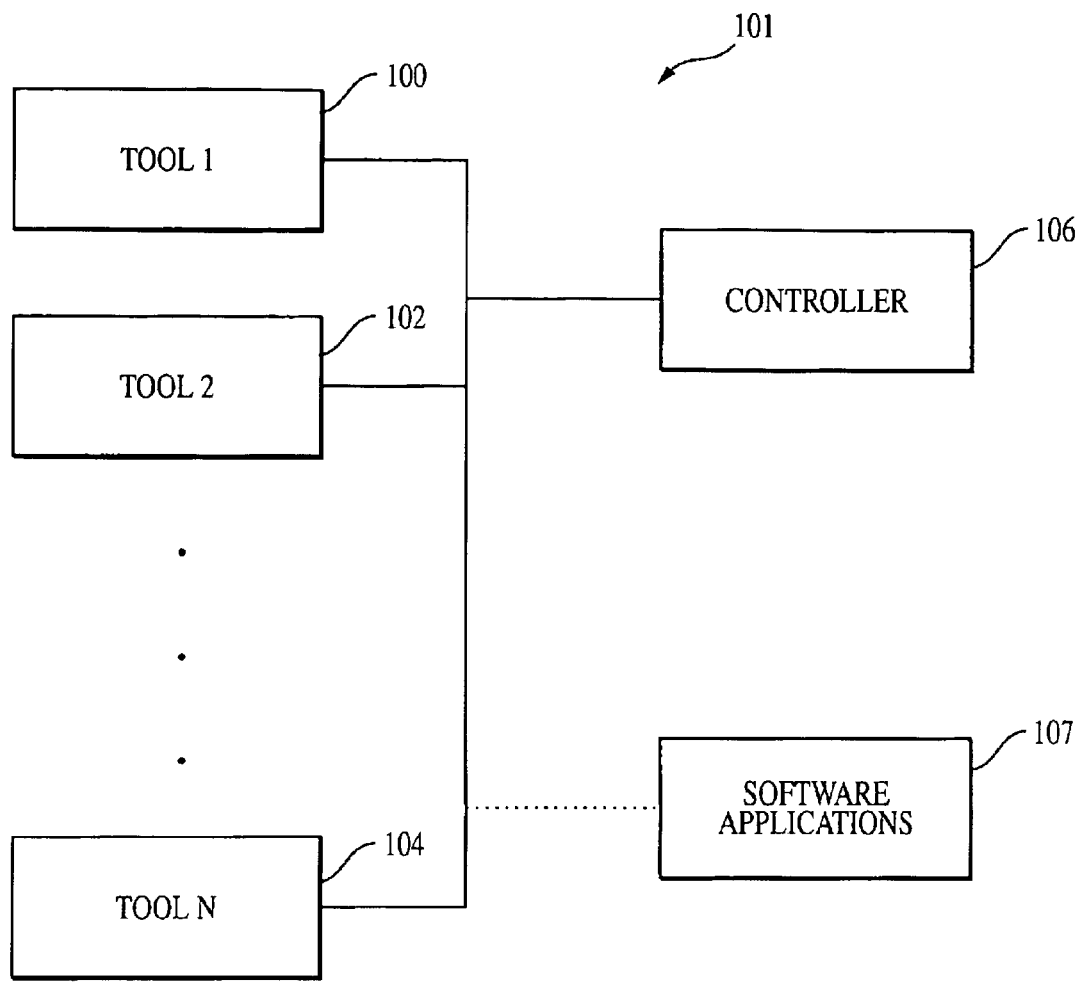
FIG. 1 is a schematic diagram of a collection of tools comprising a conventional factory.
Figure 2:
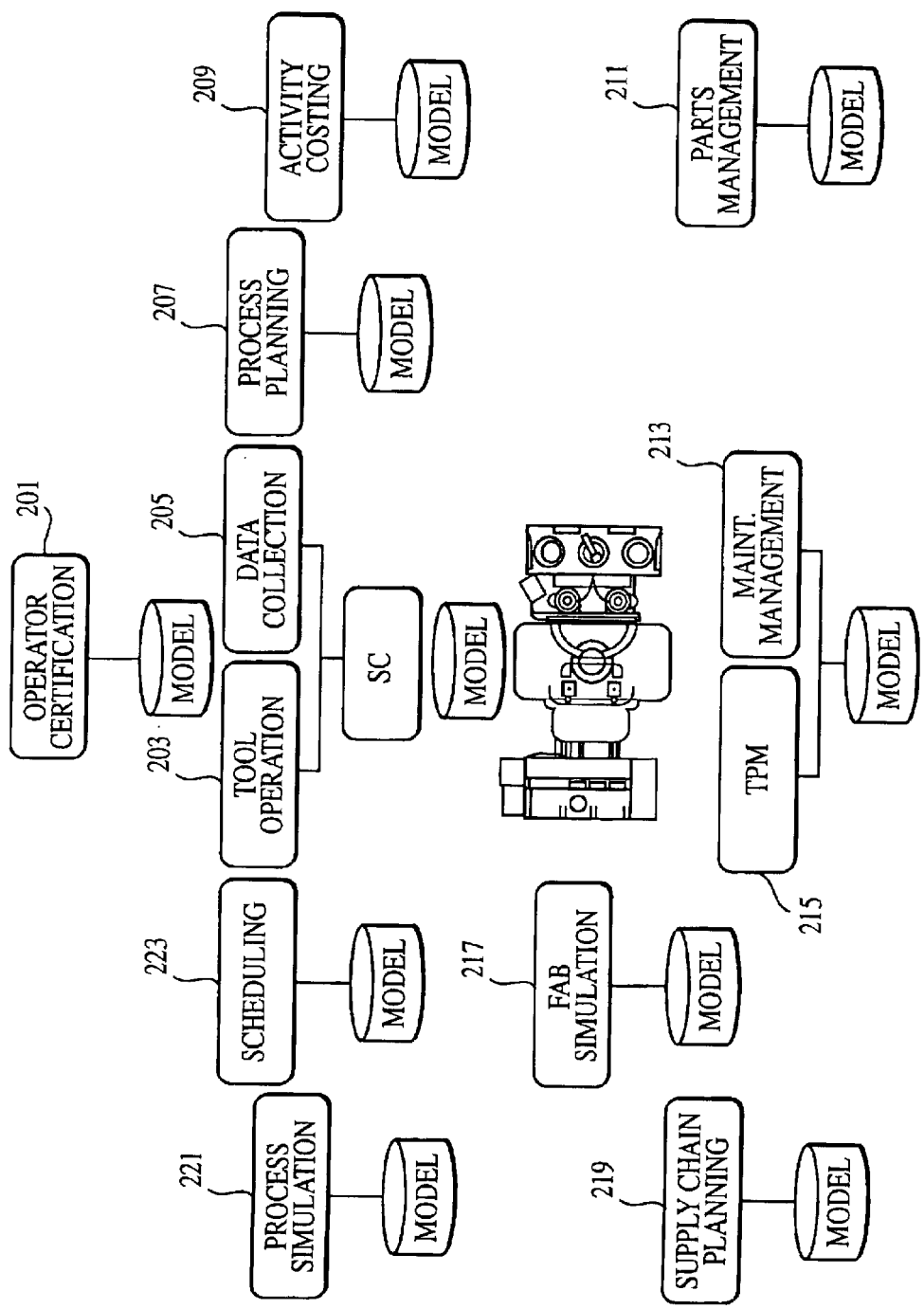
FIG. 2 is a schematic diagram of a set of conventional software applications for a conventional factory.

Using the above-described internal software applications and I/O configuration of the TRAC, an improved entity to entity relationship is established between the TRAC and various external applications. In particular, referring to FIG. 11, the external applications are no longer dependent upon individually developed and implemented models (or other intermediary devices) to represent and obtain information about the tools. The external applications can directly access the detailed status information of the tools via the TRAC. This is illustrated as a solid line between the TRACs 301, 303, 305 and external applications 309. (It should be noted that the conventional tools illustrated in FIG. 1 do not have such features. Accordingly a dotted line is drawn between the tools 100, 102, 104 and software applications 107.)

In addition, the TRAC controls the access of detailed status information by the external applications. More specifically, when the TRAC receives a request to access the detailed status information from an external application, the TRAC first determines a portion (a subset or all) of the detailed status information that the external application is allowed to access. The TRAC allows only that allowed portion to be accessed by the external application. It is envisioned that such security for the status information can be enforced by any number of different types of encryption applications.

In at least some embodiments of the present invention, the encryption application can be implemented using Virtual Private Network (VPN) technology. In addition, the portion of information accessible by a particular external application can be dynamically generated or prepackaged. Each of these pre-packages is referred as a channel. Using the VPN technology each channel can be individually secured.

For example, the maintenance management application may be required only to access information concerning when the next maintenance should take place, tool parameters, configuration and parts, and the maintenance logs. Thus, if the maintenance management application makes a request to access the detailed status information of a tool, then the tool's TRAC allows the maintenance management application to access only the information specified above. This set of information can be packaged as a maintenance channel and can be secured as such by the VPN technology.

In another example, if an external application makes a request to access a set of data in order to qualify a tool for a particular process, then quality of service parameters of the tool (either previously collected or collected in response to the request) necessary to qualify for that particular process are allowed to be accessed by the external application. This set of information can be packaged as a qualification channel for that particular process and can be secured as such by the VPN technology.

Detailed interactions envisioned by at least some embodiments of the present invention between the external applications and the internal applications are now described in connection with FIGS. 12–14. FIG. 12, which shows initial setup steps, includes external actors, such as an engineer 1201, a process engineer 1203, and an operator 1205 as well as an external application 1207. In at least some embodiments of the present invention, the TRAC can be thought of as being divided into three levels: an actions level 1209, data analysis level 1211, and an interface to the tool level 1213. In the actions level 1209, two services are available: an "R2R control" service 1215 and a "process wafer" service 1217. In the data analysis level 1211, one service is available: an "access tool data service" 1219. In the interface to tool level, four services are available: a service to "describe configuration of tool" 1221; a service to "collect data for run" 1223; a service to "adjust process recipe parameters" 1225; and a service to "adjust tool sequence recipe" 1227. These services may be performed by one or more of the internal applications illustrated in FIG. 9. The services in the interface to the tools level 1213 are configured to interface with a tool 1229, which can, e.g., include at least one metrology chamber. In an alternative embodiment, no metrology chamber may be included in the tool. In this alternative embodiment, access to a metrology chamber can be provided outside of the tool.

It should be understood that the various levels and services provided as indicated with regard to FIG. 12 are mentioned only by way of example, and that various embodiments of the present invention envision a variety of other/additional levels and/or services as well.

In operation of at least some embodiments of the present invention, the engineer 1201 initially sets up the TRAC by interfacing with it to configure the tool so that the tool and its chambers can perform a number of different processes. After the tool is configured, the engineer 1201 records how the tool is configured by describing its capabilities using the "describe configuration of tool" service 1221.

In turn, the process engineer 1203 sets up the run to run control of the tool, which is a way to control process/sequence recipes on the tool. For example, the process engineer 1203 may define mechanisms to collect relevant data, evaluate the collected data and adjust various recipe parameters according to the evaluation. More specifically, the process engineer 1203 interacts with the "run-to-run control" service 1215, which in turn makes calls to the "collect data for run" service 1223 and "adjusts process recipe parameters" services 1225 to store and manage the mechanisms defined by the process engineer 1203.

The operator 1205 can then cause the TRAC and its associated tool to perform a requested process using the "process wafers" service 1217. The "process wafers" service 1217 makes use of the "run-to-run control" service 1215 and causes the tool to run the requested process. The "process wafers" service 1217 may also use the "adjust tool sequence recipe" service 1227 to adjust sequence recipes based on the evaluation of the collected data in accordance with the mechanisms defined by the process engineer 1203 as described above.

The external application 1207 may also then make a request for data (e.g., quality of service parameters) using the "access tool data" service 1219, which in turn uses the "collect data for run" service 1223 to access the data. As noted above, in at least some embodiments of the present invention, only that portion of the collected data allowed to be accessed by the requesting external application 1207 will be exposed and accessible.

FIG. 13 illustrates services in which an external application 1301 (or an operator) may request a qualification job.

The external application 1301 first requests that the TRAC qualify its tool. In particular, it calls a "request qualification" service 1303 which in turn uses a particular sequence recipe to be run by calling an "execute tool sequence recipe" service 1305. The "execute tool sequence recipe" service 1305 causes the sequence recipe to be performed by calling an "execute process recipe" service 1307. Subsequently, relevant metrology data relating to the resultant product is collected by a "collect data" service 1309. As a result, detailed status information exemplified in FIGS. 5–8 are collected from the tool. It should be noted that in at least some embodiments of the present invention, the detailed qualification data is already collected and stored in the TRAC. In such embodiments, the external application may not call the "request qualification" service 1303, but may call a "request qual data" (quality of service data) service 1308.

As noted above, the collected data can be accessed by the external application 1301 by calling the "request qual data" application 1308. Once again, in at least some embodiments of the present invention only a portion of the collected data is made accessible by the external application 1301. In this example, information necessary to qualify the tool would be made accessible. Based on the collected data, the external application 1301 then can declare the tool as qualifying for certain processes (as exemplified in FIG. 5). This qualification outcome information can then be sent to a "receive qualification outcome" service 1311, which in turn calls an "execute state change" service 1312 in order to change the stored qualification state of the tool. In at least some embodiments of the present invention, at least one external application would access the stored qualification state, if such information is available, instead of calling the "request qual data" service 1308.

Once the tool is qualified to perform certain processes, an external application can then make a request to process a lot of wafers using one or more of the qualified processes. Referring to FIG. 14, TRAC services are shown, which are contemplated to be used in at least some embodiments of the present invention, that can be called when an external application 1401 requests a lot of wafers be processed. Specifically, a request is received by a "request tool process" service 1403 which in turn causes a sequence recipe to be created by calling a "generate tool sequence recipe" service 1405. The "generate tool sequence recipe" service 1405 then inquires about resource availability (e.g., which chambers are available and qualified to perform certain processes by referring to, e.g., the quality of service parameters exemplified in FIGS. 6–7). The inquiry can be achieved by calling a "check resource availability" service 1407 and a "check resource quality of services" service 1409. Based on the information collected using the "check resource availability" service 1407 and "check resource quality of services service" 1409, the "generate tool sequence recipe" service 1405 dynamically generates a sequence recipe and one or more process recipes to perform the process requested by the external application 1401. The dynamically generated sequence recipe and one or more process recipes are then performed by calling an "execute tool sequence recipe" service 1411 and an "execute process recipe service" 1413. The generate tool sequence recipe also determines which chamber is to perform the requested process when more than one chamber is available and qualified to perform the request process similar to the selection steps described above in connection with FIGS. 6–9. Once the process is completed, data on the processed wafers can be collected by a "collect data" service 1415 in order to update the quality of service parameters and other detailed status information of the chambers. The actual update is performed when an "update quality of services" service 1417 is called.

Figure 15:
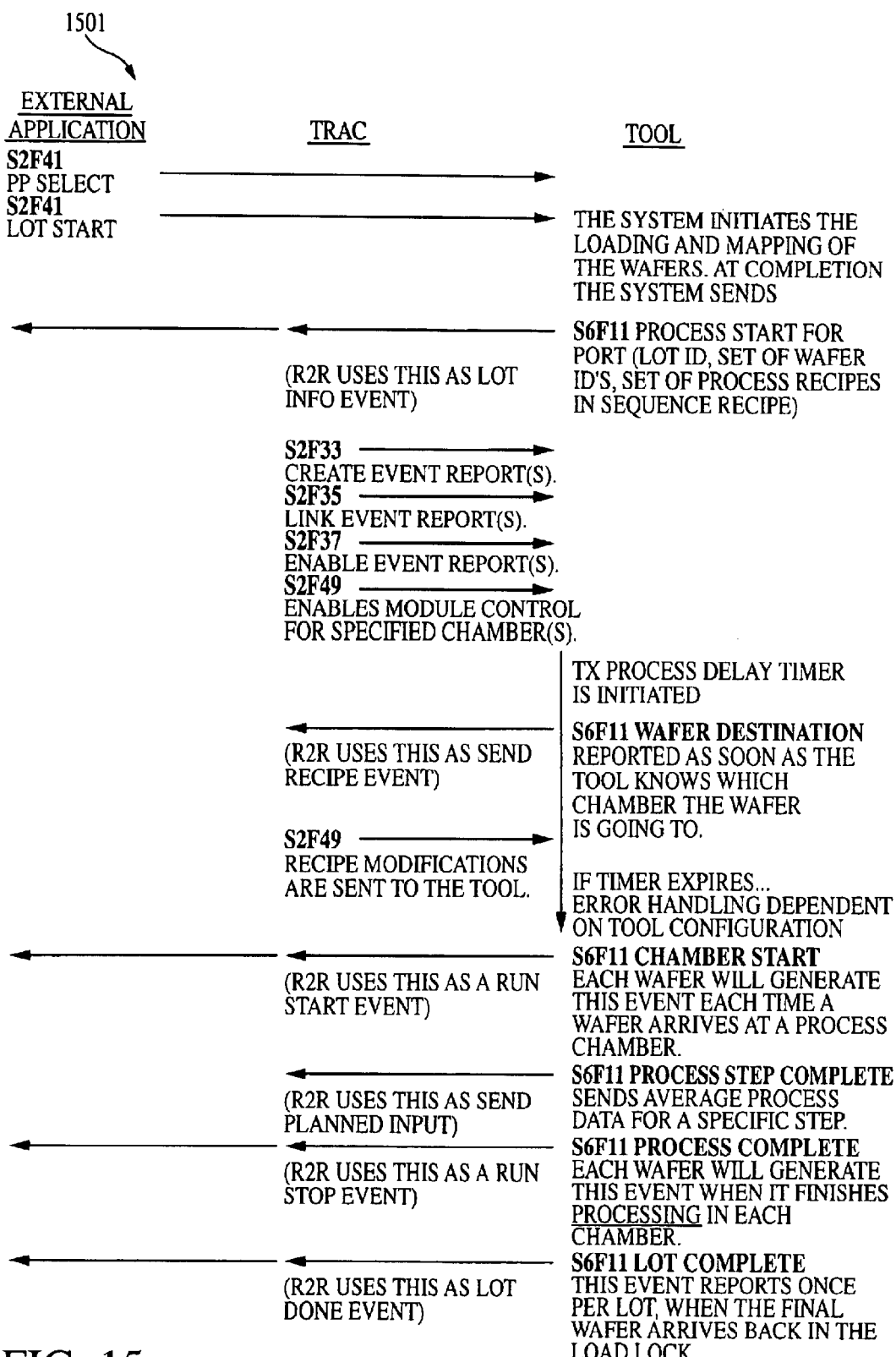
FIG. 15 is a schematic diagram of messages being exchanged between a tool and an external application in at least some embodiments of the present invention.

Now referring to FIG. 15, there is shown an example set of communication messages exchanged between a TRAC and an external application using the SECS communication protocol, which puts messages in terms of streams and functions. A stream is a related set of messages, and a function is a specific message within a stream. For instance, S2F41 (1501) signifies an external application sending a message to a tool. The message is set as stream 2, function 41, and includes an instruction "PP Select." Subsequently, the external application sends another S2F41 message that includes an instruction "Lot Start." In response to the message, the tool initiates loading and mapping of a lot of wafers. Subsequently, the tool sends an S6, F11 message which includes an instruction to "Process Start for Port" (i.e., prepare a load lock to receive a lot of wafers). FIG. 15 continues to illustrate exemplary messages that can be exchanged, which are readily understandable to one skilled in the art.

In addition to the above-described TRAC in connection with FIGS. 9–15, a partially capable TRAC can also be provided in at least some embodiments of the present invention. Furthermore, the TRACs can be used to monitor and control tools from a remote location. These features are illustrated in FIG. 16(*a*). In particular, external applications 1601, a web portal 1603, one or more TRACs 1607 for tools 1611 and a partial TRAC 1605 for a legacy tool 1609 can be connected and/or otherwise in communication with each other via, e.g., a common data communication bus 1613.

A legacy tool 1609 is a tool that is not configured to be subject to automatic qualification (or is otherwise in communication with external applications 1601 in a manner that permits them to obtain the appropriate information for qualifications). Where such a legacy tools exists, it is envisioned that an operator can manually set the qualification of the legacy tool, but an external application cannot request service calls for a qualification as describe above in connection with FIG. 13. Thus, the qualification information for the legacy tool is static (e.g., updated manually but not automatically). Accordingly, the partial TRAC 1605 is configured to use the static qualification information when controlling the legacy tool.

Using these features, an external application can request tool level qualification information from all the tools (including the legacy tools) and select which tools to use in processing a lot of wafers from their initial process to the final process to produce final products.

The remote location diagnostic (RLD) application 1615 can operate as any other external application. For instance, it can initiate a qualification job and other services described in connection with FIGS. 12–14. This allows a user located in a remote location to monitor and operate the tools over the Internet.

Figure 16B:
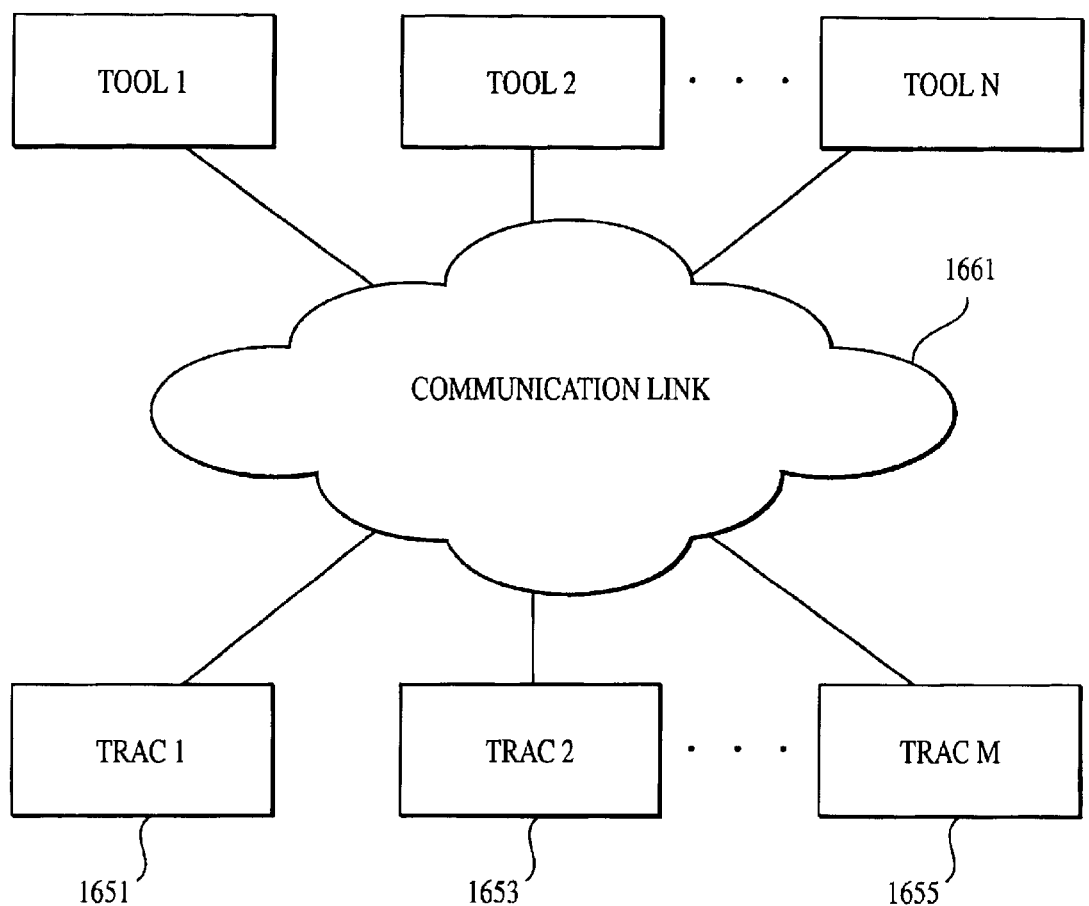
FIG. 16(b) is a schematic diagram of an alternative configuration of tools and TRACs in at least some embodiment of the present invention.

An alternative configuration of tools and TRACs that can be used in at least some embodiments of the present invention is illustrated in FIG. 16(*b*). Unlike the configuration shown in FIG. 3, in the alternative configuration, N number of TRACs (1651, 1653, 1655) are in communication with M number of tools via a Communication Link 1661. The number of TRACs can be identical to, more than or fewer than the number of tools. In at least some embodiments of the present invention, each TRAC can be in communication with any combination of tools. Similarly, each tool can be in communication with any combination of TRACs. The communication link 1661 can use any standard communication protocol (e.g., TCP/IP) running, e.g., over the Internet. (Although not shown as such in FIG. 16(b), at least some embodiments of the present invention envision N and or M each being greater than or equal to 1). In at least some embodiments, the communication link 1661 can be established using a secured method (e.g., VPN).

FIG. 17 illustrates a block diagram of one example of the internal hardware of a computer system 1711 in which the above-described internal software applications of the TRAC may reside and operate. A bus 1756 serves as the main information highway interconnecting the other components of system 1711. CPU 1758 is the central processing unit of the system, performing calculations and logic operations required to execute the processes of embodiments of the present invention as well as other programs. Read only memory (ROM) 1760 and random access memory (RAM) 1762 constitute the main memory of the system. Disk controller 1764 interfaces one or more disk drives to the system bus 1756. These disk drives are, for example, floppy disk drives 1770, or CD ROM or DVD (digital video disks) drives 1766, or internal or external hard drives 1768. These various disk drives and disk controllers are optional devices.

A display interface 1772 interfaces display 1748 and permits information from the bus 1756 to be displayed on display 1748. Display 1748 can be used in displaying a graphical user interface so that the external actors described in connection with FIG. 12 can interact with the TRAC. Communications with external devices such as the other components of the system described above can occur utilizing, for example, communication port 1774. Optical fibers and/or electrical cables and/or conductors and/or optical communication (e.g., infrared, and the like) and/or wireless communication (e.g., radio frequency (RF), and the like) can be used as the transport medium between the external devices and communication port 1774. Peripheral interface 1756 interfaces the keyboard 1750 and mouse 1752, permitting input data to be transmitted to bus 1756. In addition to these components, system 1711 also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 1780 and/or a low power radio receiver 1782. The low power radio transmitter transmits the signal for reception by components of the production process, and receives signals from the components via the low power radio receiver. The low power radio transmitter and/or receiver are standard devices in industry.

Although system 1711 in FIG. 17 is illustrated having a single processor, a single hard disk drive and a single local memory, system 1711 is optionally suitably equipped with any multitude or combination of processors or storage devices. For example, system 1711 may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

FIG. 18 is an illustration of an exemplary computer readable memory medium 1884 utilizable for storing computer readable code or instructions. As one example, medium 1884 may be used with disk drives illustrated in FIG. 17. Typically, memory media such as floppy disks, or a CD ROM, or a digital video disk will contain, for example, a multi-byte locale for a single byte language and the program information for controlling the above system to enable the computer to perform the functions described herein. Alternatively, ROM 1760 and/or RAM 1762 illustrated in FIG. 17 can also be used to store the program information that is used to instruct the central processing unit 1758 to perform the operations associated with the instant processes. Other examples of suitable computer readable media for storing information include magnetic, electronic, or optical (including holographic) storage, some combination thereof, etc. In addition, at least some embodiments of the present invention contemplate that the medium can be in the form of a transmission (e.g., digital or propagated signals).

In general, it should be emphasized that the various components of embodiments of the present invention can be implemented in hardware, software or a combination thereof. In such embodiments, the various components and steps would be implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

The many features and advantages of embodiments of the present invention are apparent from the detailed specification, and thus, it is intended by the appended claims to cover all such features and advantages of the invention which fall within the true spirit and scope of the invention. For instance, although the TRAC is described as being used with an exemplary tool, the CENTURA tools developed and manufactured by Applied Materials, Inc. of Santa Clara, Calif., it is envisioned that the TRAC can also be used with tools developed and manufactured by other companies, as long as the TRAC can collect the detailed status information from the tools. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

It is also to be appreciated and understood that the specific embodiments of the invention described hereinbefore are merely illustrative of the general principles of the invention. Various modifications may be made by those skilled in the art consistent with the principles set forth hereinbefore.

What is claimed is:

1. A semiconductor fabrication system, comprising:
    a first semiconductor fabrication tool;
        wherein the first semiconductor fabrication tool includes a first chamber configured to perform at least one process on a semiconductor wafer;
    a software application, in communication with the first semiconductor fabrication tool, configured to determine first specified qualities of the first chamber in performing the at least one process,
        wherein the first specified qualities include: a processing time required to perform the at least one process, a rate of producing defective output products of the at least one process, a uniformity of output products of the at least one process, and a capability index of the at least one process of the first chamber; and a second chamber configured to perform at least one process on a semiconductor wafer;

wherein the software application is further configured to determine second specified qualities of the second chamber in performing the at least one process, wherein the second specified qualities include: a processing time required to perform the at least one process of the second chamber, a rate of producing defective output products of the at least one process of the second chamber, a uniformity of output products of the at least one process of the second chamber, and a capability index of the at least one process of the second chamber, and wherein the software application is further configured to receive a request from an external application to qualify the first and second chambers for a first requested process and make accessible information relating to the first and second specified qualities of the first and second chambers.

2. The system of claim 1, in the software application is further configured to receive a request to perform a first requested process and select one or more of the first and second chambers to perform the first requested process based on specified preferences which form part of the request and on the information relating to the first and second specified qualities of the first and second chambers.

3. The system of claim 1, wherein the software application is further configured to generate detailed status information that includes information relating to the first specified qualities of the first chamber and relating to maintenance information of the first chamber.

4. The system of claim 3, wherein the software application is further configured to receive a request from an external application to access the detailed status information and configured to make available only a pre-defined portion of the detailed status information to be accessed by the external application.

5. A method of fabrication of semiconductors, comprising the steps of:

(1) receiving data from a semiconductor fabrication tool directed to qualities of at least one process occurring within the semiconductor fabrication tool; and (2) determining first specified qualities of a first chamber of the semiconductor fabrication tool in performing the at least one process, wherein the first specified qualities include: a processing time required to perform the at least one process, a rate of producing defective output products of the at least one process, a uniformity of output products of the at least one process, and a capability index of the at least one process of the first chamber;

(3) determining second specified qualities of a second chamber of the semiconductor fabrication tool in performing the at least one process, wherein the second specified qualities include: a processing time required to perform the at least one process, a rate of producing defective output products of the at least one process, a uniformity of output products of the at least one process, and a capability index of the at least one process of the second chamber; and (4) receiving a request from an external application to qualify the first and second chambers for a first requested process and make accessible information relating to the first and second specified qualities of the first and second chambers.

6. The method of claim 5, further comprising the step of:

receiving a request to perform a first requested process and selecting one or more of the first and second chambers to perform the first requested process based on specified preferences which form part of the request and on the information relating to the first and second specified qualities of the first and second chambers.

7. The method of claim 5, further comprising the step of:

generating detailed status information that includes information relating to the first specified qualities of the first chamber and relating to maintenance information of the first chamber.

8. The method of claim 7, further comprising the step of:

receiving a request from an external application to access the detailed status information and making available only a pre-defined portion of the detailed status information to be accessed by the external application.

* * * * *